United States Patent
Wu et al.

(10) Patent No.: US 11,831,126 B2
(45) Date of Patent: Nov. 28, 2023

(54) LASER PROJECTION DEVICE

(71) Applicant: Hisense Laser Display Co., Ltd, Qingdao (CN)

(72) Inventors: Kai Wu, Qingdao (CN); Rongrong Cui, Qingdao (CN); Xu Chen, Qingdao (CN)

(73) Assignee: HISENSE LASER DISPLAY CO., LTD, Qingdao (CN)

( * ) Notice: Subject to any disclaimer, the term of this patent is extended or adjusted under 35 U.S.C. 154(b) by 106 days.

(21) Appl. No.: 17/491,458

(22) Filed: Sep. 30, 2021

(65) Prior Publication Data

US 2022/0021181 A1 Jan. 20, 2022

Related U.S. Application Data

(63) Continuation-in-part of application No. PCT/CN2020/090952, filed on May 19, 2020.

(30) Foreign Application Priority Data

Jun. 20, 2019 (CN) .......................... 201910537287.4

(51) Int. Cl.
*H01S 5/042* (2006.01)
*H01S 5/40* (2006.01)
(Continued)

(52) U.S. Cl.
CPC ........ *H01S 5/0428* (2013.01); *G03B 21/2013* (2013.01); *G03B 21/2033* (2013.01); *H01S 5/4093* (2013.01); *H04N 9/3161* (2013.01)

(58) Field of Classification Search
CPC ............ G03B 21/2013; G03B 21/2033; H01S 5/0428; H04N 9/3167
(Continued)

(56) References Cited

U.S. PATENT DOCUMENTS

| 8,469,520 B2* | 6/2013 | Maeda ................... G03B 33/06 353/38 |
| 9,560,328 B1 | 1/2017 | McVittie |

(Continued)

FOREIGN PATENT DOCUMENTS

| CN | 101620837 A | 1/2010 |
| CN | 101897191 A | 11/2010 |

(Continued)

OTHER PUBLICATIONS

First Office Action issued in corresponding Chinese Patent Application No. 201910537287.4 dated May 17, 2021, with English translation.

(Continued)

*Primary Examiner* — Jerry L Brooks
(74) *Attorney, Agent, or Firm* — Morgan, Lewis & Bockius LLP

(57) ABSTRACT

A laser projection apparatus includes a laser source, an optical engine, a projection lens, and a circuit system architecture. The circuit system architecture is configured to control the laser source to emit laser beams of three primary colors. The circuit system structure includes: a display control circuit, a first laser chip driving circuit, a second laser chip driving circuit, and a third laser chip driving circuit. The display control circuit is configured to generate three PWM signals and three enable signals. The laser chip driving circuit is electrically connected to the display control circuit, and is configured to receive a PWM signal of a corresponding color and an enable signal of the corresponding color, so as to drive a laser chip of the corresponding color to emit laser beams of the corresponding color.

18 Claims, 16 Drawing Sheets

(51) Int. Cl.
*H04N 9/31* (2006.01)
*G03B 21/20* (2006.01)

(58) Field of Classification Search
USPC .......................................................... 353/94
See application file for complete search history.

(56) References Cited

U.S. PATENT DOCUMENTS

| | | | |
|---|---|---|---|
| 2009/0160833 A1 | 6/2009 | Brown et al. | |
| 2010/0079730 A1 | 4/2010 | Shibasaki | |
| 2013/0329755 A1 | 12/2013 | Arntsen et al. | |
| 2014/0160439 A1* | 6/2014 | Ikeda | G03B 21/2053 353/31 |
| 2015/0350616 A1 | 12/2015 | Nishioka et al. | |
| 2016/0134850 A1 | 5/2016 | Nakao et al. | |
| 2017/0318271 A1 | 11/2017 | Sourani | |

FOREIGN PATENT DOCUMENTS

| | | |
|---|---|---|
| CN | 101945291 A | 1/2011 |
| CN | 102520568 A | 6/2012 |
| CN | 202443239 U | 9/2012 |
| CN | 103676145 A | 3/2014 |
| CN | 104503195 A | 4/2015 |
| CN | 104795727 A | 7/2015 |
| CN | 106249530 A | 12/2016 |
| CN | 107643645 A | 1/2018 |
| CN | 108141002 A | 6/2018 |
| CN | 108333857 A | 7/2018 |
| CN | 109283783 A | 1/2019 |
| CN | 109300429 A | 2/2019 |
| CN | 109358468 A | 2/2019 |
| JP | H05-289597 A | 11/1993 |

OTHER PUBLICATIONS

Second Office Action issued in corresponding Chinese Patent Application No. 201910537287.4 dated Nov. 30, 2021, with English translation.

International Search Report and Written Opinion issued in corresponding International Application No. PCT/CN2020/090952 dated Jul. 29, 2020, with English translation.

* cited by examiner

LASER PROJECTION DEVICE

CROSS-REFERENCE TO RELATED APPLICATIONS

This application is a continuation-in-part of International Application No. PCT/CN2020/090952, with an international filing date of 19 May 2020, which claims the priority to Chinese Patent Application No. 201910537287.4, filed 20 Jun. 2019. Their entire contents are hereby incorporated by reference herein.

TECHNICAL FIELD

The application relates to the field of laser projection technologies, and in particular, to a laser projection apparatus.

BACKGROUND

A laser projection apparatus such as a laser TV or a laser projector is widely used in the display field due to its advantages of high color purity, large color gamut, and high brightness. The laser projection apparatus uses a laser source having advantages of good monochromaticity, high brightness, and long service life, which makes it an ideal laser source. The laser source provides illumination beams containing three primary colors for the laser projection apparatus. The laser projection apparatus converts the illumination beams into projection beams according to an image signal, thereby projecting an image on a screen or a wall.

SUMMARY

A laser projection apparatus is provided. The laser projection apparatus includes a laser source, an optical engine, a projection lens and a circuit system architecture. The laser source is configured to provide illumination beams, and the laser source includes a laser assembly encapsulated with laser chips of three primary colors. The optical engine is configured to modulate the illumination beams using an image signal to obtain projection beams. The projection lens is configured to project the projection beams for imaging. The circuit system structure is configured to control the laser source to emit laser beams of three primary colors.

The circuit system structure includes a display control circuit and a laser chip driving circuit.

The display control circuit is configured to generate three pulse width modulation (PWM) signals corresponding to the laser chips of the three primary colors based on three primary color components of an image to be displayed, and generate three enable signals corresponding to the laser chips of the three primary colors based on a preset ratio of a lighted period of the laser chips of the three primary colors in one drive period. Each PWM signal is configured to control a brightness of laser beams emitted by a laser chip of a corresponding color. Each enable signal is configured to control a lighted period of a laser chip of a corresponding color in one drive period.

The laser chip driving circuit is electrically connected to pins corresponding to the laser chips of the three primary colors. The laser chip driving circuit is electrically connected to the display control circuit, and is configured to receive a PWM signal of a corresponding color and an enable signal of the corresponding color, so as to drive a laser chip of a corresponding color to emit laser beams of the corresponding color according to the PWM signal of the corresponding color when the enable signal of the corresponding color is at an effective potential.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals to which the embodiments of the present disclosure relate.

Figure 1:
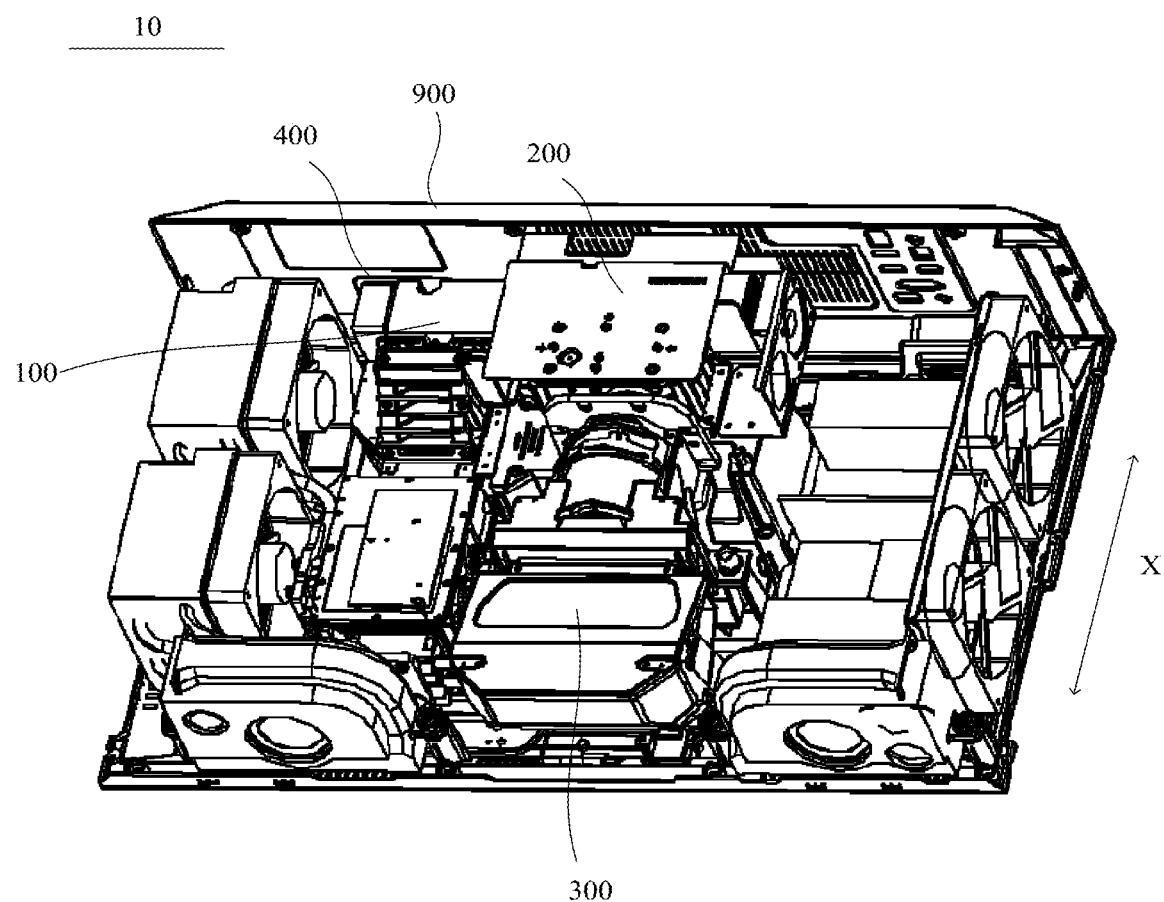
FIG. 1 is a diagram showing a structure of a laser projection apparatus, in accordance with some embodiments.

The accompanying drawings herein are incorporated into the description and constitute a part of this description, and show embodiments consistent with the application, and are used to explain principles of the application together with the description.

DETAILED DESCRIPTION

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as being open and inclusive, meaning "including, but not limited to".

In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined with "first" and "second" may explicitly or implicitly include one or more of the features. In the description of the embodiments of the present disclosure, the term "a plurality of" means two or more unless otherwise specified.

In the description of some embodiments, the terms "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [stated condition or event]", depending on the context.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Terms such as "parallel", "perpendicular", or "equal" as used herein includes a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., limitations of a measurement system). For example, the term "parallel" includes absolute parallel and approximate parallel, and the acceptable deviation range for the approximate parallel may be, for example, a deviation within 5°. The term "perpendicular" includes absolute vertical and approximate vertical, and the acceptable deviation range of the approximate vertical may also be, for example, a deviation within 5°. The term "equal" includes absolute equality and approximate equality, and the acceptable deviation range of the approximate equality may be that, for example, a difference between the two that are equal is less than or equal to 5% of either of the two.

Some embodiments of the present disclosure provide a laser projection apparatus. As shown in FIG. 1, the laser projection apparatus 10 includes an apparatus housing 900 (only part of the housing 900 is shown in FIG. 1), and a laser source 100, an optical engine 200 and a projection lens 300 that are assembled in the apparatus housing 900. The laser source 100 is configured to provide illumination beams (laser beams). The optical engine 200 is configured to modulate the illumination beams provided by the laser source 100 with image signals to obtain projection beams. The projection lens 300 is configured to project the projection beams on a screen or a wall for imaging. In some embodiments, the laser projection apparatus 10 further includes a screen. The screen is disposed in a laser-exit path of the projection lens 300, and the projection beams emitted by the projection lens 300 form an image on the screen.

The laser source 100, the optical engine 200, and the projection lens 300 are sequentially connected in a propagation direction of the beams, and are each wrapped by a corresponding housing. The housings of the laser source 100, the optical engine 200 and the projection lens 300 support their corresponding optical components respectively and make the optical components meet certain sealing or airtight requirements. For example, the laser source 100 is hermetically sealed through its corresponding housing, which may well solve a light attenuation problem of the laser source 100.

Figure 2:
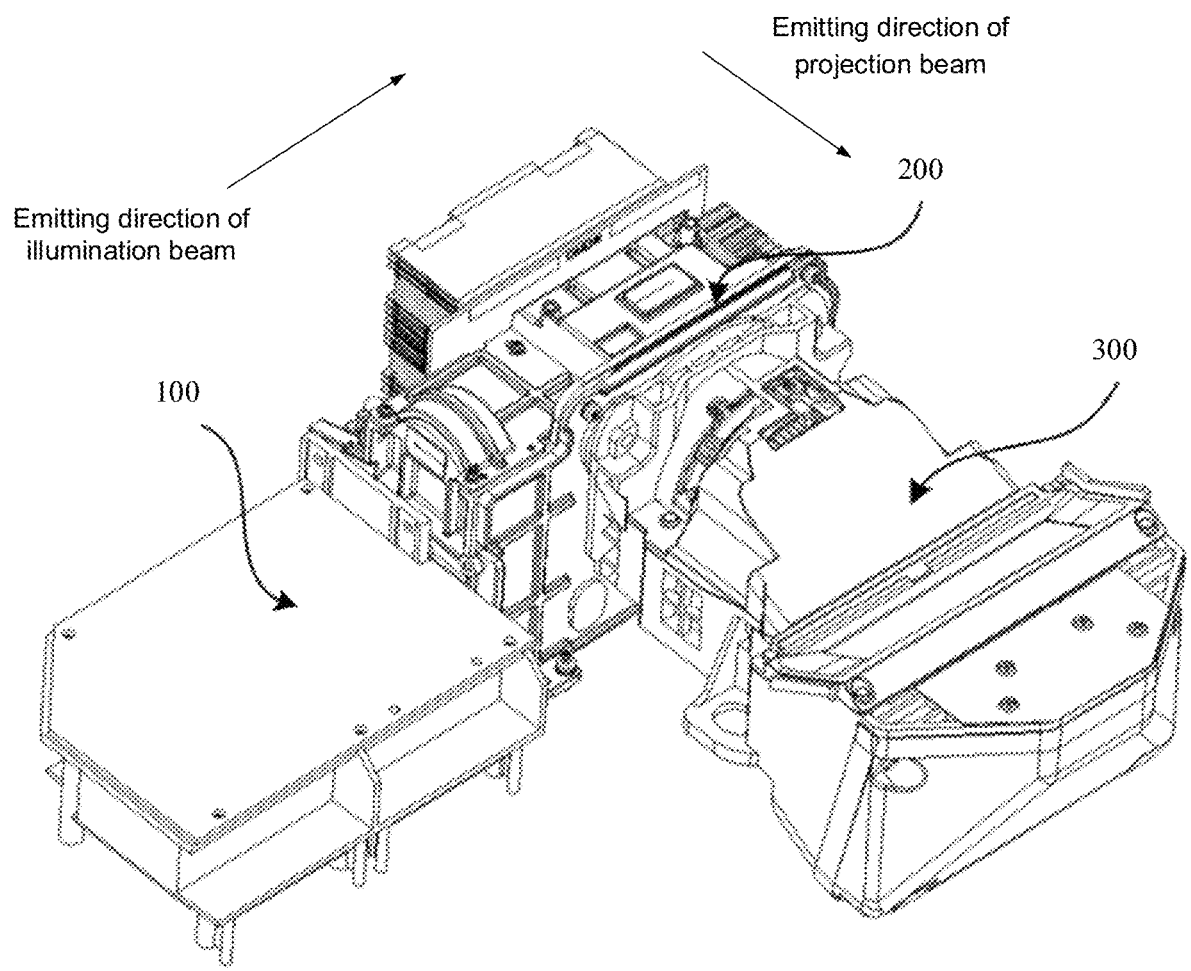
FIG. 2 is a diagram showing a structure of a laser source, an optical engine, and a projection lens in a laser projection apparatus, in accordance with some embodiments.

One end of the optical engine 200 is connected to the projection lens 300, and the optical engine 200 and the projection lens 300 are arranged in a first direction X; for example, the first direction X may be a direction of the projection beams of the laser projection apparatus 10. The other end of the optical engine 200 is connected to the laser source 100. In an example as shown in FIG. 2, the laser source 100, the optical engine 200, and the projection lens 300 are connected in an "L" shape. That is, the direction of the projection beams of the laser projection apparatus 10 is substantially perpendicular to a direction of the illumination beams of the laser projection apparatus 10. On one hand, such connection structure may adapt to characteristics of a beam path of a reflective light valve in the optical engine 200, and on another hand, it is also conducive to shortening a length of a beam path in a one-dimensional direction, which is helpful for structural arrangement of the laser projection apparatus 10. For example, in a case where the laser source 100, the optical engine 200, and the projection lens 300 are disposed in the one-dimension direction (e.g., a direction perpendicular to the first direction X), a length of a beam path in the direction is large, which is not conducive to the structural arrangement of the laser projection apparatus 10.

Figure 3:
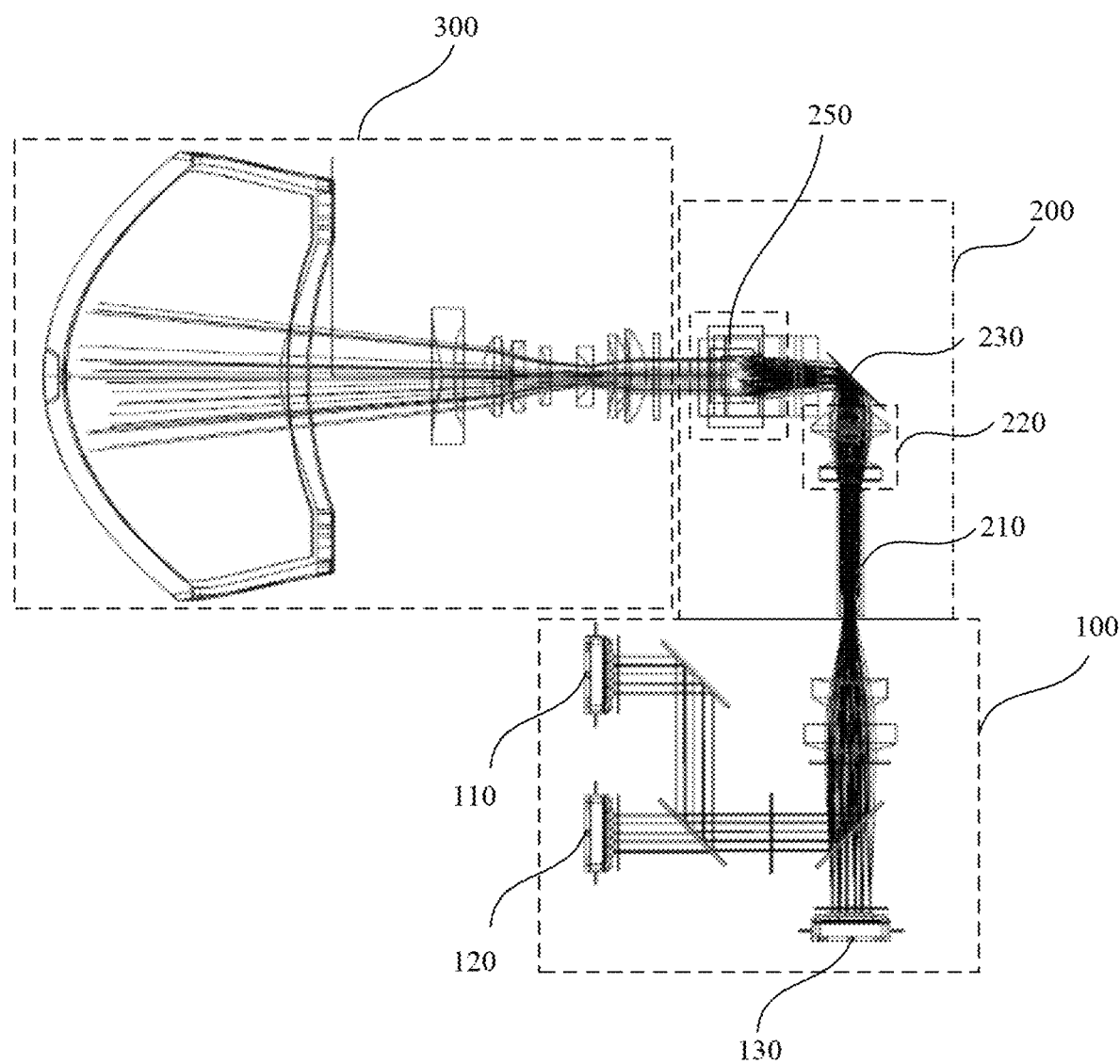
FIG. 3 is a diagram showing a simplified structure of a laser source, an optical engine, and a projection lens in a laser projection apparatus, in accordance with some embodiments.

In some embodiments, referring to FIG. 3, the laser source 100 may include three laser arrays. The three laser arrays may be a red laser array 130, a green laser array 120, and a blue laser array 110 respectively. That is, the laser source 100 is a tri-color laser source, but is not limited thereto. The three laser arrays may also all be blue laser arrays 110, and in this case, the laser source 100 is a mono-color laser source. Or, the three laser arrays may be two blue laser arrays 110 and one red laser array 130, and in this case, the laser source 100 is a dual-color laser source.

Figure 4:
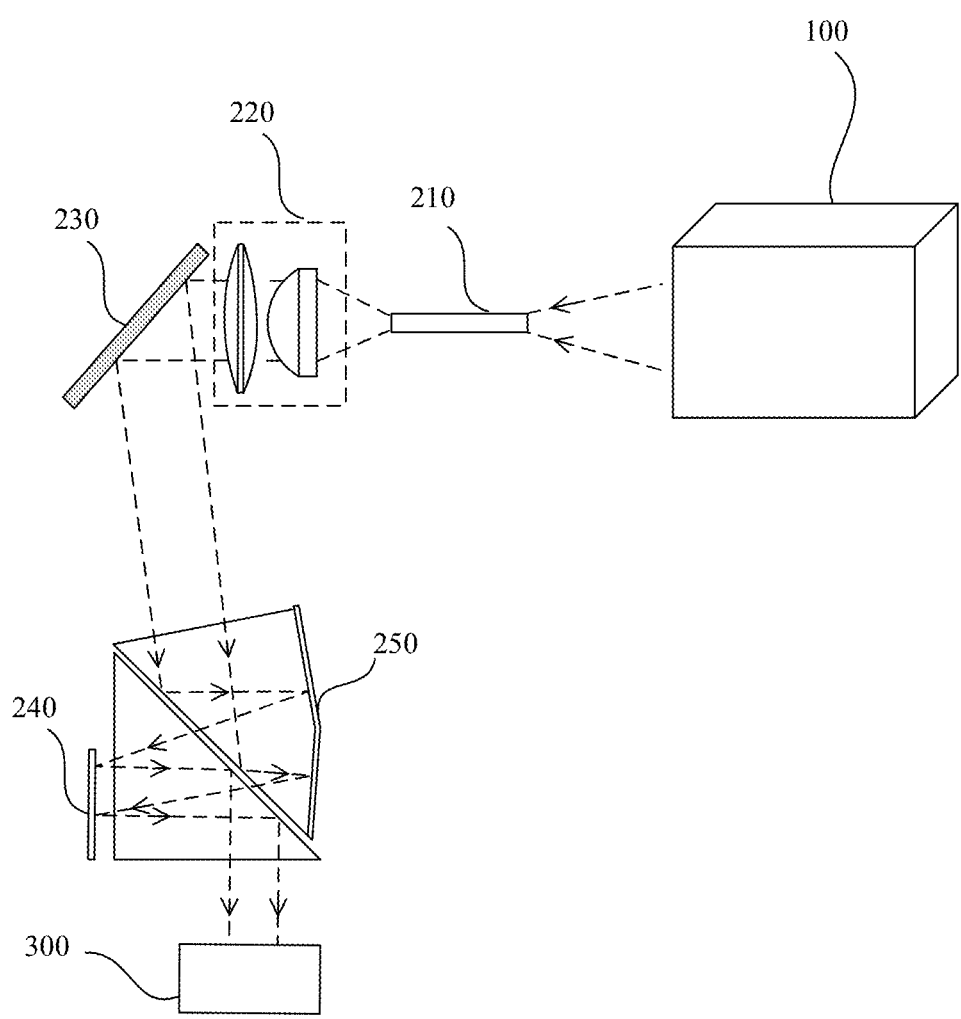
FIG. 4 is a schematic diagram showing a structure of a beam path in a laser projection apparatus, in accordance with some embodiments.

The illumination beams emitted by the laser source 100 enter the optical engine 200. Referring to FIGS. 3 and 4, the optical engine 200 may include a light pipe 210, a lens assembly 220, a reflector 230, a digital micromirror device (DMD) 240 and a prism assembly 250. The light pipe 210 may receive the illumination beams provided by the laser source 100 and homogenize the illumination beams. The lens assembly 220 may first collimate the illumination beams homogenized by the light pipe 210, and then converge the collimated illumination beams and emit the converged illumination beams to the reflector 230. The reflector 230 may reflect the illumination beams that are first collimated and then converged by the lens assembly 220 to the prism assembly 250. The prism assembly 250 reflects the illumination beams reflected by the reflector 230 to the DMD 240. The DMD 240 modulates the illumination beams to obtain the projection beams, and reflects the projection beams obtained by modulating the illumination beams into the projection lens 300.

In the optical engine 200, the DMD 240 is a core component, which plays a role of modulating the illumination beams provided by the laser source 100 through the image signals. That is, the DMD 240 controls the projection beams to display different colors and luminance according to different pixels of an image to be displayed, so as to finally form an optical image. Therefore, the DMD 240 is also referred to as an optical modulator or a light valve. Depending on whether the optical modulator (or the light valve) transmits or reflects the illumination beams, the optical modulator (or the light valve) may be classified as a transmissive optical modulator (or light valve) or a reflective optical modulator (or light valve). For example, the DMD 240 shown in FIG. 4 reflects the illumination beams, and thus it is a reflective optical modulator. A liquid crystal light valve transmits the illumination beams, and thus it is a transmissive optical modulator. In addition, according to the number of the optical modulators (or the light valves) used in the optical engine, the optical engine may be classified as a single-chip system, a double-chip system, or a three-chip system. For example, only one DMD 240 is used in the optical engine 200 shown in FIG. 4, and thus the optical engine 200 may be referred to as a single-chip system. In a case where three digital micromirror devices are used, the optical engine 200 may be referred to as a three-chip system.

Figure 5:
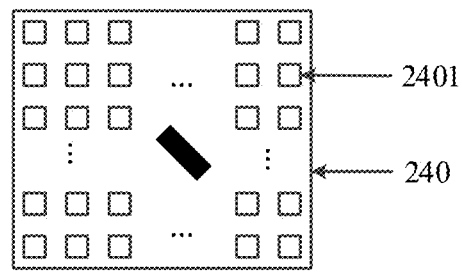
FIG. 5 is a diagram showing an arrangement of micromirrors in a digital micromirror device, in accordance with some embodiments.
Figure 6:
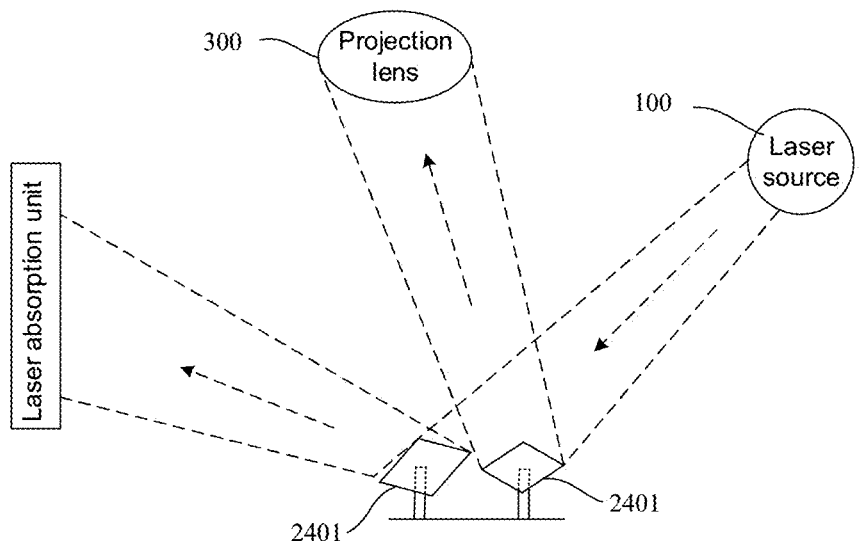
FIG. 6 is a schematic diagram showing a swing position of a micromirror in the digital micromirror device shown in FIG. 5.

The digital micromirror device 240 is applied to a digital light processing (DLP) projection structure. As shown in FIG. 5, the digital micromirror device 240 includes thousands of micromirrors 2401 that may be individually driven to rotate. These micromirrors 2401 are arranged in an array, and each micromirror 2401 corresponds to one pixel in the image to be displayed. As shown in FIG. 6, in the DLP projection structure, each micromirror 2401 is equivalent to a digital switch. The micromirror may swing by a range of plus or minus 12 degrees (i.e., ±12°) or a range of plus or minus 17 degrees (i.e., ±17°) due to action of an external force.

Figure 7:
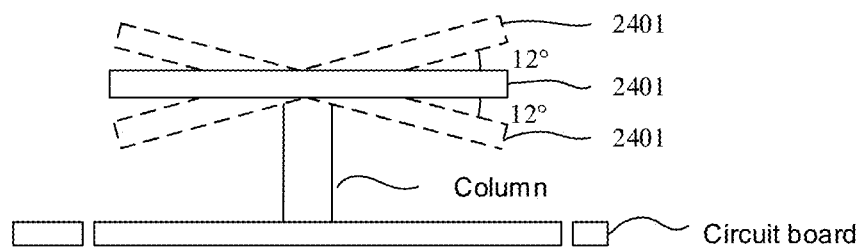
FIG. 7 is a schematic diagram showing operation of micromirrors, in accordance with some embodiments.

As shown in FIG. 7, a laser beam reflected by the micromirror 2401 at a negative deflection angle is referred to as an OFF laser beam, and the OFF laser beam is an ineffective laser beam, and which is usually irradiated on the housing 900 of the laser projection apparatus 10 and the housing of the optical engine 200, or is absorbed by a laser absorption unit. A laser beam reflected by the micromirror 2401 at a positive deflection angle is referred to as an ON laser beam. The ON laser beam is an effective beam that enters the projection lens 300 at a positive deflection angle after the micromirror 2401 on a surface of the DMD 240 receives irradiation of the illumination beams, and is used to project an image. An ON state of the micromirror 2401 is a state that the micromirror 2401 is in and may be maintained when the illumination beams emitted by the laser source 100 may enter the projection lens 300 after being reflected by the micromirror 2401. That is, the micromirror 2401 is in a state of a positive deflection angle. An OFF state of the micromirror 2401 is a state that the micromirror 2401 is in and may be maintained when the illumination beams emitted by the laser source 100 does not enter the projection lens 300 after being reflected by the micromirror 2401. That is, the micromirror 2401 is in a state of a negative deflection angle.

For example, for a micromirror 2401 with a deflection angle of +12°, a state at +12° is the ON state, and a state at −12° is the OFF state. For a deflection angle between −12° and +12°, it is not used in practice, and actual operation states of the micromirror 2401 are only the ON state and the OFF state. For a micromirror 2401 with a deflection angle of ±17°, a state at +17° is the ON state, and a state at −17° is the OFF state. The image signals are converted into digital codes such as 0 or 1 after being processed, and these digital codes may drive the micromirrors 2401 to swing.

In a display cycle of a frame image, part or all of the micromirrors 2401 are switched once between the ON state and the OFF state, so that gray scales of pixels in the frame image are achieved according to durations of the micromirrors 2401 in the ON state and the OFF state. For example, in a case where the pixels have 256 gray scales from 0 to 255, micromirrors corresponding to a gray scale 0 are each in the OFF state in an entire display cycle of the frame image, micromirrors corresponding to a gray scale 255 are each in the ON state in the entire display cycle of the frame image, and micromirrors corresponding to a gray scale 127 are each in the ON state for a half of time and in the OFF state for the other half of time in the display cycle of the frame image. Therefore, by controlling a state that each micromirror in the DMD 240 is in and a duration of each state in the display cycle of the frame image through the image display signals, luminance (the gray scale) of a pixel corresponding to the micromirror 2401 may be controlled, and a purpose of modulating the illumination beams projected onto the DMD 240 may be achieved.

The light pipe 210, the lens assembly 220 and the reflector 230 in front of the DMD 240 form an illumination path. After passing through the illumination path, the illumination beams emitted by the laser source 100 are made to conform to a beam size and an incident angle required by the DMD 240.

As shown in FIG. 3, the projection lens 300 includes a combination of a plurality of lenses, which are usually divided by group, and are divided into a three-segment combination including a front group, a middle group and a rear group, or a two-segment combination including a front group and a rear group. The front group is a lens group proximate to a laser-exit side of the laser projection apparatus (a left side shown in FIG. 3), and the rear group is a lens group proximate to a laser-exit side of the optical engine 200 (a right side shown in FIG. 3). The projection lens 300 may be a zoom projection lens, or a prime adjustable-focus projection lens, or a prime projection lens. In some embodiments, the laser projection apparatus is an ultra-short-focus projection apparatus. The projection lens 300 is an ultra-short-focus projection lens, and a projection ratio of the projection lens 300 is usually less than 0.3, such as 0.24.

Figure 8:
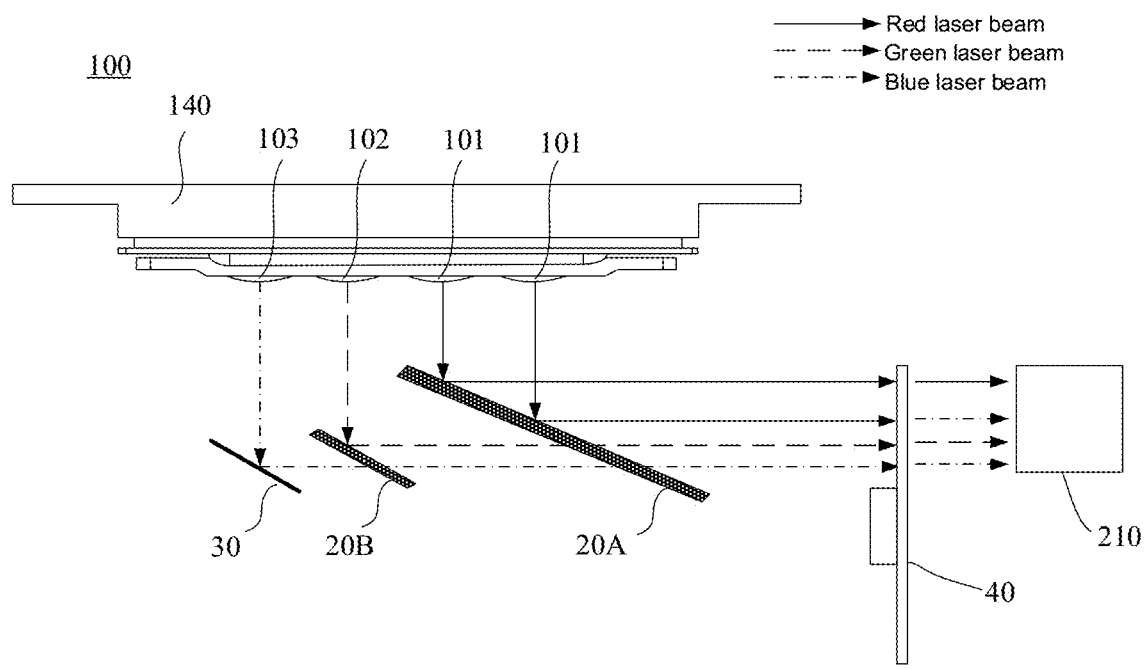
FIG. 8 is a diagram showing a structure of a laser source, in accordance with some embodiments.
Figure 9:
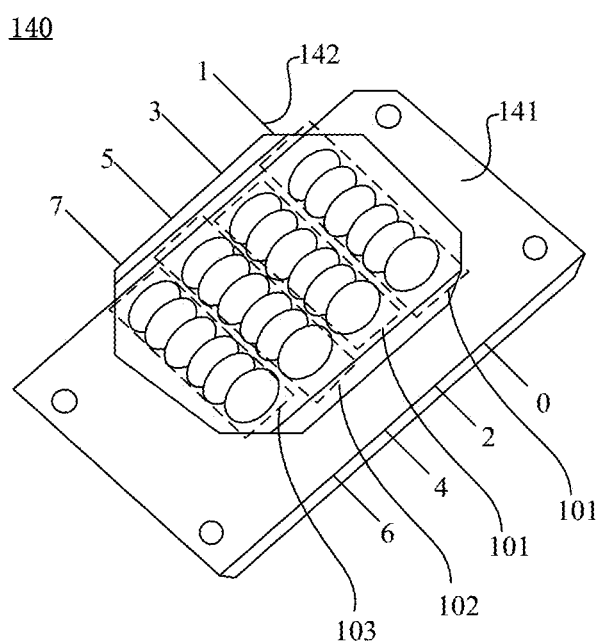
FIG. 9 is a diagram showing a structure of a laser assembly in the laser source shown in FIG. 8.

Different from the laser source 100 used in the laser projection apparatus shown in FIG. 3, referring to FIGS. 8 and 9, the laser source 100 used in the laser projection apparatus of some embodiments may include only one laser assembly 140, and the laser assembly 140 is encapsulated with laser chips of three primary colors. The laser chips of the three primary colors include: two rows of red laser chips 101 capable of emitting red laser beams, one row of green laser chips 102 capable of emitting green laser beams, and one row of blue laser chips 103 capable of emitting blue laser beams. The laser source 100 further includes dichroic mirrors 20A and 20B, a reflector 30 and a diffusion wheel 40. The red laser beams emitted from the two rows of red laser chips 101 are reflected by the dichroic mirror 20A onto the diffusion wheel 40. The green laser beams emitted from the green laser chips 102 are first reflected by the dichroic mirror 20B onto the dichroic mirror 20A, and then transmitted to diffusion wheel 40 through the dichroic mirror 20A. The blue laser beams emitted from the blue laser chips 103 may be first reflected onto the dichroic mirror 20B through the reflector 30, and then transmitted to the diffusion wheel 40 through the dichroic mirror 20B and the dichroic mirror 20A in sequence. Laser beams irradiated onto the diffusion wheel 40 are homogenized by the diffusion wheel 40 to form illumination beams, and then the illumination beams enter the light pipe 210 of the optical engine 200.

Unlike the red laser array 130 which includes only red laser chips, the green laser array 120 which includes only green laser chips, and the blue laser array 110 which includes only blue laser chips in FIG. 3, the laser assembly 140 includes red laser chips 101, green laser chips 102 and blue laser chips 103. Therefore, in a case where the laser source 100 includes only one laser assembly 140, illumination beams containing laser beams of three primary colors may be generated. Therefore, there is no need to provide a phosphor wheel in the laser source 100 (in a case where one or more laser arrays included in a laser source can only produce laser beams of one or two colors, it is necessary to use the laser beams of the existing color to excite the phosphor wheel to generate fluorescence beams of other colors, so that the laser beams and the fluorescence beams together form white beams). As a result, in some embodiments of the present disclosure, the structure of the laser source 100 can be simplified, and the volume of the laser source 100 can be reduced.

In actual use, in order to increase the brightness of the illumination beams, the laser source 100 may include two or more laser assemblies 140.

In some embodiments, the laser assembly 140 may be a multi-chip laser diode (MCL) assembly. In the MCL assembly, a plurality of laser chips are encapsulated on a substrate to form an area laser source. The MCL assembly has a small volume, thereby reducing the volume of the laser source 100. As shown in FIG. 9, the laser assembly 140 includes a metal substrate 141. A plurality of laser chips are encapsulated on the metal substrate 141. Each laser chip may be wrapped by a transistor outline (TO). The plurality of laser chips may be arranged in a 4×6 array, or may be arranged in other arrays, such as a 3×5 array, a 2×7 array, a 2×6 array, or a 4×5 array. Overall luminous power of laser chips with different numbers of arrays is different.

Laser chips in each row may be connected in series. For example, each row of red laser chips 101 is connected in series, each row of green laser chips 102 is connected in series, and each row of blue laser chips 103 is connected in series. The series manner of each row of laser chips may be wired series connection or board series connection. The wired series connection means that the plurality of laser chips are connected end to end in sequence through wires. The board series connection means that the plurality of laser chips are connected end to end in sequence through wiring on the surface or in the interlayer of the metal substrate 141.

Figure 10:
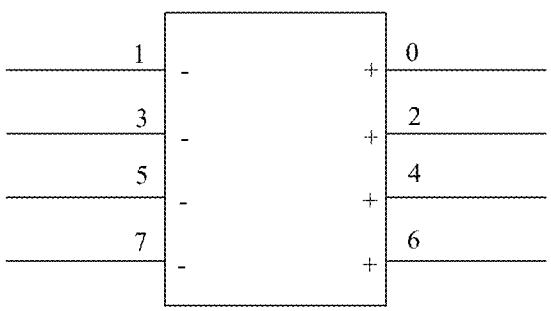
FIG. 10 is an equivalent circuit diagram of the laser assembly shown in FIG. 9.

There are pins 142 protruding from two sides of the metal substrate 141. These pins 142 may drive each row of laser chips to emit laser beams. As shown in FIGS. 9 and 10, one row of red laser chips 101 includes a pin 0 and a pin 1, the other row of red laser chips 101 includes a pin 2 and a pin 3, the row of green laser chips 102 includes a pin 4 and a pin 5, and the row of blue laser chips 103 includes a pin 6 and a pin 7.

It can be seen from the above that each laser assembly 140 includes at least two kinds of laser chips to generate laser beams of at least two colors, thereby simplifying the structure of the laser source 100. However, due to the increase of colors of the laser beams emitted by each laser assembly, more precise control on the laser assemblies is required.

As a result, as shown in FIG. 1, the laser projection apparatus 10 further includes a power system architecture 400, and the power system architecture 400 may be a printed circuit board assembly (PCBA). FIG. 1 only shows an approximate position of the power system architecture 400, and a specific position of the power system architecture 400 may be arranged differently in different laser projection apparatuses 10. The power system architecture 400 is a control system circuit for controlling the laser source 100 to emit light, and is configured to control the laser source 100 to emit illumination beams with three primary colors according to the image quality requirement of the laser projection apparatus 10.

In some embodiments, description is made by taking an example in which the laser source 100 includes at least one laser assembly 140, and each laser assembly 140 includes the laser chips of the three primary colors, and the laser chips of three primary colors include red laser chips 101, green laser chips 102 and blue laser chips 103.

Figure 11A:
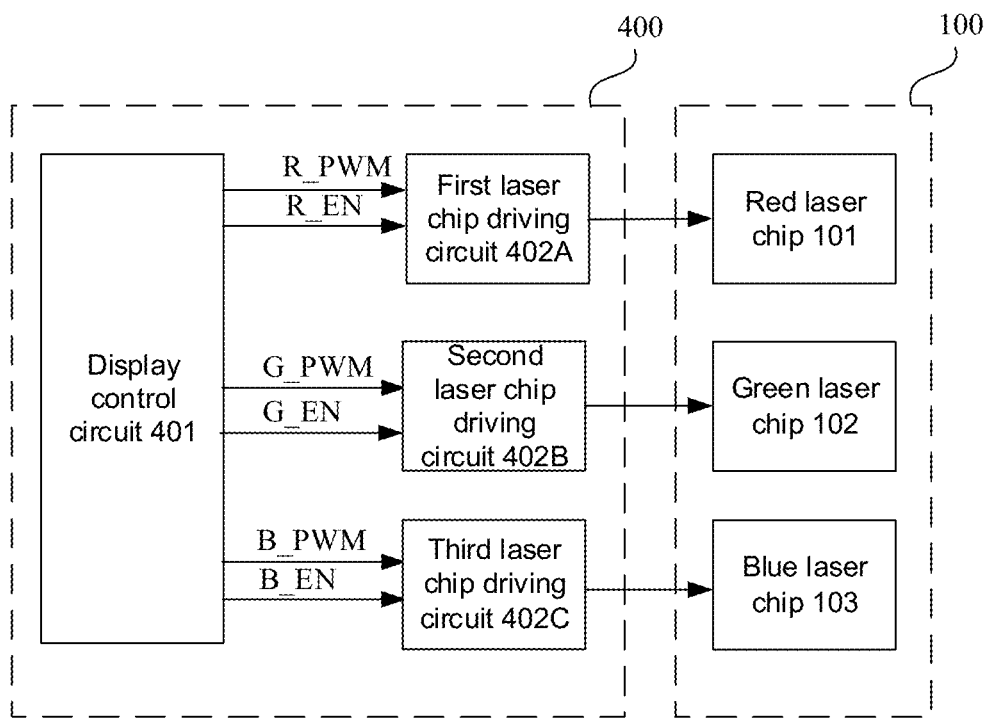
FIGS. 11A and 11B are diagrams of two different circuit system architectures of a laser projection apparatus, in accordance with some embodiments.

As shown in FIG. 11A, the circuit system architecture 400 includes a display control circuit 401 and laser chip driving circuits 402A, 402B, and 402C. A first laser chip driving circuit 402A is connected to the red laser chips 101 and is configured to control the red laser chips 101 to emit red illumination beams. A second laser chip driving circuit 402B is connected to the green laser chips 102 and is configured to control the green laser chips 102 to emit green illumination beams. A third laser chip driving circuit 402C is connected to the blue laser chips 103 and is configured to control the blue laser chips 103 to emit blue illumination beams.

The display control circuit 401 is electrically connected to the three laser chip driving circuits 402A, 402B, and 402C, and is configured to generate three pulse width modulation (PWM) signals (R_PWM, G_PWM, and B_PWM) corresponding to the laser chips of the three primary colors (i.e., the red laser chips 101, the green laser chips 102 and the blue laser chips 103) based on three primary color components of the image to be displayed. The display control circuit 401 is also configured to generate three enable signals (R_EN, G_EN, and B_EN) corresponding to the laser chips of the three primary colors based on a preset ratio of a lighted period of the laser chips of the three primary colors in one drive period. The PWM signal is configured to control a brightness of a laser beam emitted from a laser chip of a corresponding color. The enable signal is configured to control the lighted period of the laser chip of the corresponding color in one drive period.

Of course, in some embodiments, the display control circuit 401 may also be configured to generate three PWM signals corresponding to the laser chips of the three primary colors (i.e., the red laser chips 101, the green laser chips 102 and the blue laser chips 103) based on three primary color components in a preset color scheme of the laser projection apparatus 10. Since the three primary color components in the preset color scheme of the laser projection apparatus 10 are set according to the final image quality requirement and meet a fixed ratio, the PWM signals will not change with each frame of image. Such manner may be adopted in a case where a response speed of the circuits in the circuit system architecture 400 is slow, and it will not affect the final projection image quality of the laser projection apparatus.

Compared with the solution that the display control circuit 401 generates three PWM signals corresponding to the laser chips of the three primary colors based on three primary color components in a preset color scheme of the laser projection apparatus 10, that the display control circuit 401 generates three PWM signals corresponding to the laser chips of the three primary colors based on three primary color components of the image to be displayed has an advantage that the laser chips of the three primary colors may adjust the brightness of laser beams of three colors according to the three primary color components in each frame of image, which may effectively avoid the waste of the laser source and reduce the power consumption of laser projection apparatus.

For example, the refresh rate of the laser projection apparatus 10 per second is 120 Hz, and then a display cycle of one frame of color image is 8.33 ms. If the refresh rate of the laser projection apparatus 10 per second is 240 Hz, and then the display cycle of one frame of color image is 4.167 ms. One drive period of the laser chips of the three primary colors is the same as the display cycle of one frame of color image.

For example, the display control circuit 401 may generate a red PWM signal R_PWM (i.e., a first PWM signal) corresponding to the red laser chips 101 based on a red component of the image to be displayed, and generate an enable signal R_EN (i.e., a first enable signal) corresponding to the red laser chips 101 based on a preset ratio of a lighted period of the red laser chips 101 in one drive period.

The display control circuit 401 may also generate a green PWM signal G_PWM (i.e., a second PWM signal) corresponding to the green laser chips 102 based on a green component of the image to be displayed, and generate an enable signal G_EN (i.e., a second enable signal) corresponding to the green laser chips 102 based on a preset ratio of a lighted period of the green laser chips 102 in one drive period.

The display control circuit 401 may also generate a blue PWM signal B_PWM (i.e., a third PWM signal) corresponding to the blue laser chips 103 based on a blue component of the image to be displayed, and generate an enable signal B_EN (i.e., a third enable signal) corresponding to the blue laser chips 103 based on a preset ratio of a lighted period of the blue laser chips 103 in one drive period.

As shown in FIG. 11A, the laser chip driving circuits 402A, 402B, and 402C are connected to the outputs of the display control circuit 401, and are configured to receive the PWM signals and the enable signals corresponding to the laser chips of the three primary colors output by the display control circuit 401, and each of them outputs a driving voltage or a driving current according to the PWM signal when the enable signal is at an effective potential (e.g., a high level or a high potential), so that the laser chips of the three primary colors emit illumination beams under driving of the driving voltage or the driving current.

For example, the display control circuit 401 includes at least six outputs, which are an R_PWM output, an R_EN output, a G_PWM output, a G_EN output, a B_PWM output, and a B_EN output. The display control circuit 401 may be a general central processing unit (CPU), a microprocessor unit (MPU), a chip, a microchip, an integrated circuit (IC), etc. For example, the display control circuit 401 is a digital light processing (DLP) chip, the DLP chip may be a DLPC6421 chip, or the DLP chip may be a DDP4422 chip.

The R_PWM output is configured to output a red PWM signal R_PWM. The R_EN output is configured to output an enable signal R_EN corresponding to the red laser chips 101. Inputs of the first laser chip driving circuit 402A are connected to the R_PWM output and the R_EN output of the display control circuit 401, and are configured to receive the red PWM signal R_PWM and the enable signal R_EN. Moreover, when the received enable signal R_EN is at an effective potential (e.g., a high potential, which is also referred to as a high level), the first laser chip driving circuit 402A adjusts a red laser driving voltage output by the first laser chip driving circuit 402A according to a voltage of the received PWM signal R_PWM, and applies the red laser driving voltage to the pins of the red laser chips 101, so that the red laser chips 101 emit red laser beams.

The G_PWM output is configured to output a green PWM signal G_PWM. The G_EN output is configured to output an enable signal G_EN corresponding to the green laser chips 102. Inputs of the second laser chip driving circuit 402B are connected to the G_PWM output and the G_EN output of the display control circuit 401, and are configured to receive the green PWM signal G_PWM and the enable signal G_EN. Moreover, when the received enable signal G_EN is at an effective potential (e.g., a high potential, which is also referred to as a high level), the second laser chip driving circuit 402B adjusts a green laser driving voltage output by the second laser chip driving circuit 402B according to a voltage of the received PWM signal G_PWM, and applies the green laser driving voltage to the pins of the green laser chips 102, so that the green laser chips 102 emit green laser beams.

The B_PWM output is configured to output a blue PWM signal B_PWM. The B_EN output is configured to output an enable signal B_EN corresponding to the blue laser chips 103. Inputs of the third laser chip driving circuit 402C are connected to the B_PWM output and the B_EN output of the display control circuit 401, and are configured to receive the blue PWM signal B_PWM and the enable signal B_EN. Moreover, when the received enable signal B_EN is at an effective potential (e.g., a high potential, which is also referred to as a high level), the third laser chip driving circuit 402C adjusts a blue laser driving voltage output by the third laser chip driving circuit 402C according to a voltage of the received PWM signal B_PWM, and applies the blue laser driving voltage to the pins of the blue laser chips 103, so that the blue laser chips 103 emit blue laser beams.

Figure 11B:
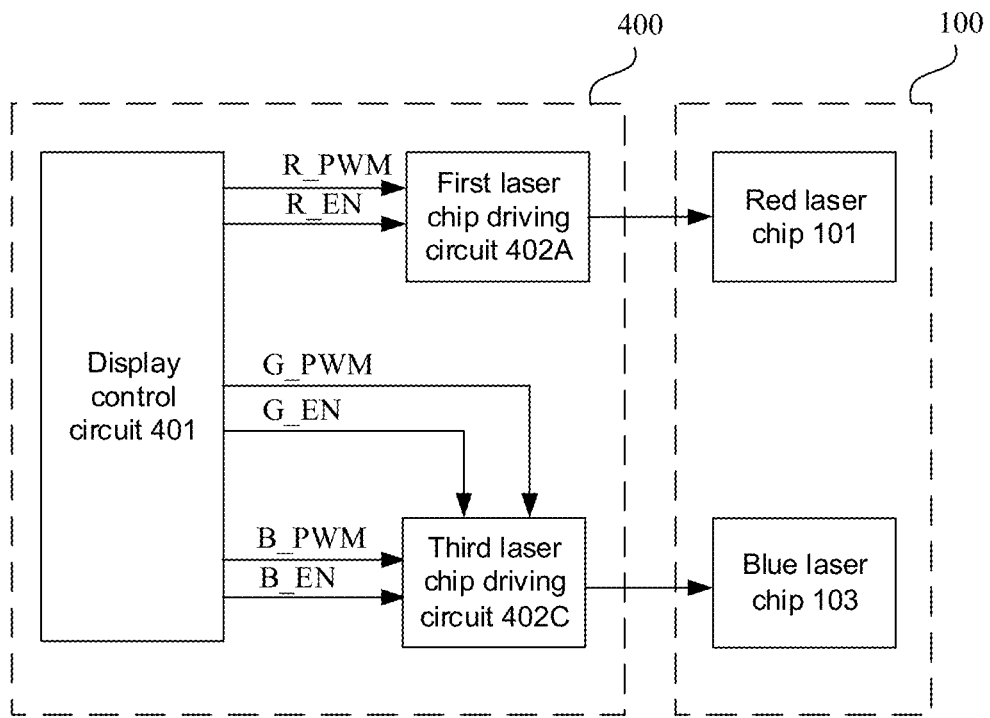

Of course, in some embodiments, each laser assembly 140 in the laser source 100 may also include laser chips of only two colors, such as red laser chips and blue laser chips. In this case, as shown in FIG. 11B (for similar situations, please refer to FIGS. 18B, 20B and 24B), the circuit system architecture 400 may only include two laser chip driving circuits. The two laser chip driving circuits may be electrically connected to pins corresponding to the laser chips of two colors, and are both electrically connected to the display control circuit 401. The two laser chip driving circuits may be a first laser chip driving circuit and a second laser chip driving circuit.

The first laser chip driving circuit is configured to receive the red PWM signal R_PWM and the enable signal R_EN, so as to drive the red laser chips to emit red laser beams (i.e., the first color laser beams) according to the red PWM signal R_PWM when the enable signal R_EN is at the effective potential.

The third laser chip driving circuit is configured to receive the green PWM signal G_PWM and the enable signal G_EN, so as to drive the blue laser chips to emit blue laser beams (i.e., the second color laser beams) according to the green PWM signal G_PWM when the enable signal G_EN is at the effective potential, and make the blue laser beams irradiated on the phosphor wheel to generate the green fluorescence beams (i.e., the second color fluorescence beams).

The third laser chip driving circuit is also configured to receive the blue PWM signal B_PWM and the enable signal B_EN, so as to drive the blue laser chips to emit blue laser beams (i.e., the third color laser beams) according to the blue PWM signal B_PWM when the enable signal B_EN is at the effective potential.

For example, in some embodiments, one drive period of the laser source 100 may include a timing output phase and a superimposed output phase. In the timing output phase, the laser source 100 may output laser beams of different colors in sequence under control of the laser chip driving circuits 402A, 402B, and 402C. For example, in the timing output phase, the laser source 100 outputs red laser beams, green laser beams and blue laser beams in sequence. In the superimposed output phase, the laser source 100 may output laser beams emitted from the laser chips of two colors at the same time. Laser beams of two colors are superposed to form laser beams of a new color. For example, red laser beams and green laser beams are superimposed to form yellow laser beams, or green laser beams and blue laser beams are superimposed to form cyan laser beams, or red laser beams and blue laser beams are superimposed to form purple laser beams.

In the timing output phase, periods during which the three enable signals generated by the display control circuit 401 are at effective potentials do not overlap each other. For example, in a red laser beam output phase, the enable signal R_EN corresponding to the red laser chips 101 generated by the display control circuit 401 is at the effective potential. In a green laser beam output phase, the enable signal G_EN corresponding to the green laser chips 102 generated by the display control circuit 401 is at the effective potential. In a blue laser beam output phase, the enable signal B_EN corresponding to the blue laser chips 103 generated by the display control circuit 401 is at the effective potential.

In the superimposed output phase, periods during which M enable signals are at the effective potential among the three enable signals generated by the display control circuit 401 overlap, and M is a positive integer greater than one and less than three.

For example, when the red laser beams and the green laser beams are superimposed, the enable signal R_EN and the enable signal G_EN generated by the display control circuit 401 are both at the effective potential. When the green laser beams and the blue laser beams are superimposed, the enable signal G_EN and the enable signal B_EN generated by the display control circuit 401 are both at the effective potential.

It should be understood that, in a case where the laser chips of the three primary colors are required to emit laser beams of a certain color, the display control circuit 401 may generate enable signal(s) corresponding to the laser chips of one or more colors according to the timing of the drive period of the laser source 100.

It will be noted that, a ratio of the duration during which each enable signal (i.e., the enable signals R_EN, G_EN and B_EN) is at the effective potential in each drive period of the laser source 100 is determined according to the optimal chromaticity coordinate required by the image quality of the laser projection apparatus 10. The optimal chromaticity coordinate may be a fixed chromaticity coordinate determined in advance based on market research and user experience. According to the optimal chromaticity coordinate, a ratio (i.e., the preset ratio) of the lighted period of the laser chips of each color in the laser chips of the three primary colors in each drive period may be determined. A duty cycle of the enable signal corresponding to the laser chips of each color may be determined according to the ratio.

For example, the laser source 100 includes the laser chips of the three primary colors, and the laser chips of three primary colors include the red laser chips 101, the green laser chips 102, and the blue laser chips 103. When the laser projection apparatus 10 meets the requirement of the optimal chromaticity coordinate, the ratio (i.e., the preset ratio) of the lighted periods of the red laser chips 101, the green laser chips 102, and the blue laser chips 103 in each drive period is supposed as 2:3:1. If one drive period only includes the timing output phase, then R1:G1:B1 is equal to 2:3:1 (R1:G1:B1=2:3:1). R1 represents duration during which the enable signal R_EN is at the effective potential in a drive period. G1 represents duration during which the enable signal G_EN is at the effective potential in a drive period. B1 represents duration during which the enable signal B_EN is at the effective potential in a drive period.

In addition, the laser projection apparatus 10 also has a brightness requirement. In a case where one drive period only includes the timing output phase, laser beams emitted by the laser source 100 may not meet the brightness requirement of the laser projection apparatus 10. Therefore, the brightness of the laser source 100 may be improved by adding a superimposed output phase in each drive period under the premise that the optimal chromaticity coordinate remains unchanged. For example, a first superimposed output phase Y may be added in each drive period. In this case, in order to ensure that the optimal chromaticity coordinate remains unchanged, (R2+Y):(G2+Y): B2 is equal to 2:3:1 (i.e., (R2+Y):(G2+Y):B2=2:3:1). R2 represents duration during which the enable signal R_EN is at the effective potential in the timing output phase. G2 represents duration during which the enable signal G_EN is at the effective potential in the timing output phase. B2 represents duration during which the enable signal B_EN is at the effective potential in the timing output phase. Y represents duration of the first superimposed output phase. In the first superimposed output phase, the red laser chips 101 and the green laser chips 102 are lit at the same time. That is, in the first superimposed output phase, the enable signal R_EN and the enable signal G_EN are both at the effective potential.

In order to further improve the brightness of the laser projection apparatus, a second superimposed output phase C may also be added in each drive period. In this case, in order to ensure that the optimal chromaticity coordinate remains unchanged, (R3+Y) (G3+Y+C):(B3+C) is equal to 2:3:1 (i.e., (R3+Y):(G3+Y+C):(B3+C)=2:3:1). R3 represents duration during which the enable signal R_EN is at the effective potential in the timing output phase. G3 represents duration during which the enable signal G_EN is at the effective potential in the timing output phase. B3 represents duration during which the enable signal B_EN is at the effective potential in the timing output phase. Y represents duration of the first superimposed output phase. C represents duration of the second superimposed output phase. In the second superimposed output phase, the green laser chips 102 and the blue laser chips 103 are lit at the same time. That is, in the second superimposed output phase, the enable signal G_EN and the enable signal B_EN are both at the effective potential.

Figure 12:
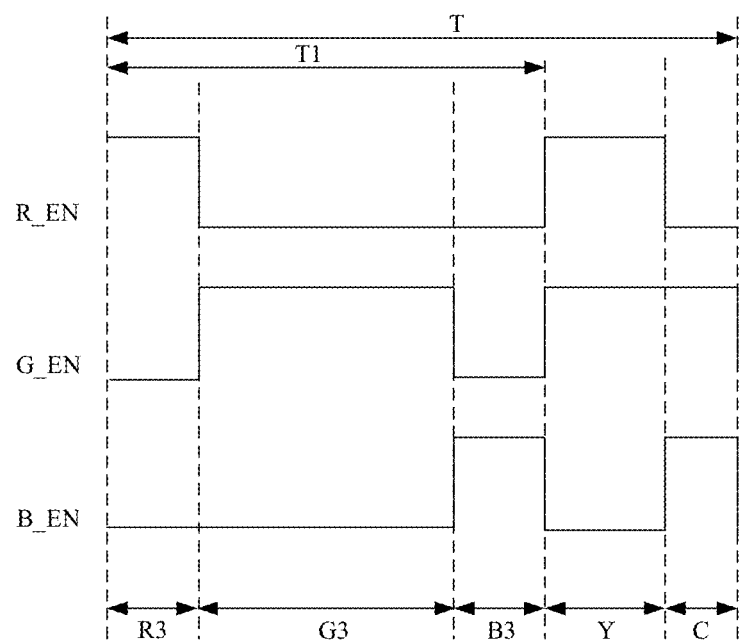
FIG. 12 is a timing diagram of enable signals output by a display control circuit, in accordance with some embodiments.

Of course, for different laser projection apparatuses 10, in a case where the optimal chromaticity coordinate is met, the preset ratio that the lighted periods of the red laser chips 101, the green laser chips 102, and the blue laser chips 103 need to be met in each drive period may be different. That is, the ratio is not limited to 2:3:1. For example, as shown in FIG. 12, one drive period T includes one timing output phase T1, one first superimposed output phase Y, and one second superimposed output phase C. In the timing output phase T1, the enable signal R_EN, the enable signal G_EN, and the enable signal B_EN are at the effective potential in sequence. In the case where the optimal chromaticity coordinate is met, the duration R3 during which the enable signal R_EN is at the effective potential accounts for 14.65% of the drive period T, the duration G3 during which the enable signal G_EN is at the effective potential accounts for 46.97% of the drive period T, and the duration B3 during which the enable signal B_EN is at the effective potential accounts for 11.38% of the drive period T. The duration of the first superimposed output phase Y accounts for 16% of the drive period T. The duration of the second superimposed output phase C accounts for 11% of the drive period T.

In this way, by adding the first superimposed output phase and the second superimposed output phase, the brightness of the laser source 100 may be increased without changing the ratio of the lighted period of the laser chips of each color in one drive period (i.e., without changing a ratio of each primary color in the original white balance).

In addition, if there is yellow in an image displayed by the laser projection apparatus 10, the laser source 100 may emit yellow laser beams by adding the first superimposed output phase in each drive period, which may effectively improve the display effect of the image. Similarly, if there is cyan in the image displayed by the laser projection apparatus, the laser source 100 may emit cyan laser beams by adding the second superimposed output phase in each drive period, which may effectively improve the display effect of the image. In this way, not only is the display brightness of each color in the laser source 100 increased, but also each color in the image displayed by the laser projection apparatus is more vivid and has a wider color gamut.

The laser chip driving circuits 402A, 402B, and 402C may adopt a boost driving mode or a buck driving mode to drive the laser chips of the corresponding colors to emit laser beams. The boost driving refers to boosting a low power supply voltage to an operating voltage of the laser chips, so that the laser chips may normally operate at a constant current. The buck driving refers to reducing a high power supply voltage to the operating voltage of the laser chips, so that the laser chips may work normally at a constant current. The power supply voltage is generally provided by the laser chip driver circuits 402A, 402B, and 402C.

In some embodiments, for example, the laser chip driving circuits 402A, 402B and 402C adopt the buck driving mode to drive the laser chips of the corresponding colors to emit laser beams.

Table 1 shows the correspondences between the constant current and the operating voltage of the red laser chips 101, the green laser chips 102 and the blue laser chips 103.

TABLE 1

| Laser chips | Red laser chip | Green laser chip | Blue laser chip |
| --- | --- | --- | --- |
| Constant operating current/A | 3 | 1.6 | 2.25 |
| Operating voltage/V | 24.6 | 28.5 | 27 |

As shown in Table 1, the constant current of the red laser chips is 3 A, and their operating voltage is 24.6V. The constant operating current of the green laser chips is 1.6 A, and their operating voltage is 28.5V. The constant operating current of the blue laser chips is 2.25 A, and their operating voltage is 27V.

The driving voltages output by the laser chip driving circuits 402A, 402B, and 402C need to match the operating voltages of the laser chips of the corresponding colors. Generally, the ratio of the operating voltage of the laser chips of each color to the power supply voltage provided by the corresponding laser chip driving circuit is 85% to 95%.

As can be seen from table 1, the power supply voltage of the first laser chip driving circuit 402A corresponding to the red laser chips 101 may be within a range of 25.9V to 28.9V, such as 25.9V, 27V, 28V, or 28.9V. The power supply voltage of the second laser chip driving circuit 402B corresponding to the green laser chips 102 may be within a range of 30V to 33.5V, such as 30V, 32V, or 33.5V. The power supply voltage of the third laser chip driving circuit corresponding to the blue laser chips 103 may be within a range of 28.5V to 31.7V, such as 28.5V, 30V, or 31.7V.

The structure and the principle of the laser chip driving circuit will be described below by taking the first laser chip driving circuit 402A corresponding to the red laser chips 101 as an example.

Figure 13:
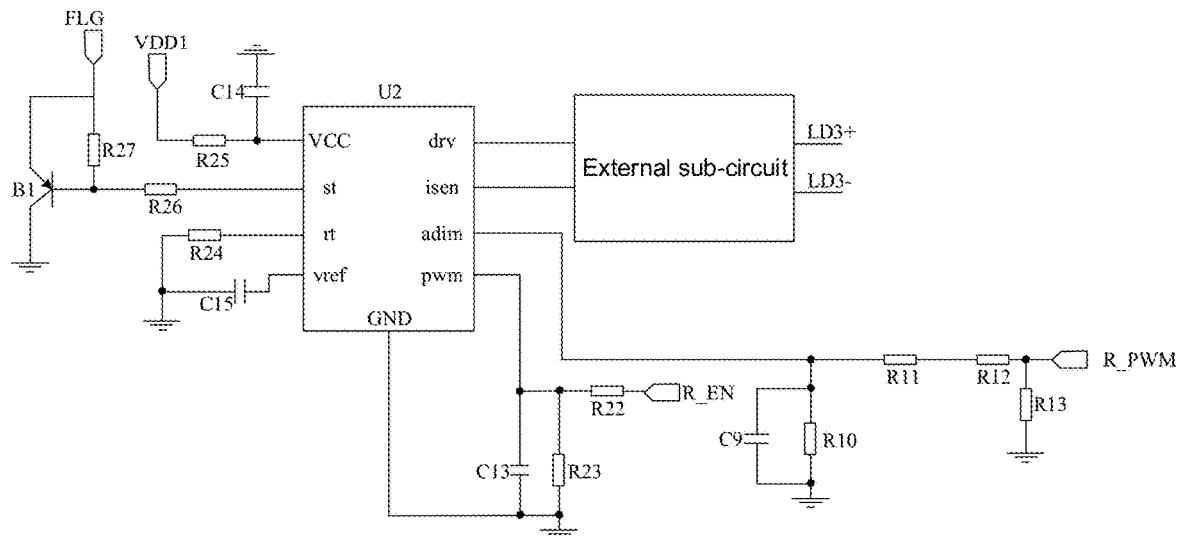
FIG. 13 is a schematic diagram showing a structure of a first laser chip driving circuit, in accordance with some embodiments.

As shown in FIG. 13, the first laser chip driving circuit 402A includes: a driving chip U2 and an external sub-circuit connected to the driving chip U2. The external sub-circuit includes a positive output LD3+ and a negative output LD3− which are used as driving outputs of the laser chip driving circuit 402A. The positive output LD3+ may be connected to the pins 0 and 2 of the red laser chips 101, and the negative output LD3− may be connected to the pins 1 and 3 of the red laser chips 101.

The driving chip U2 is configured to receive the red PWM signal R_PWM and the enable signal R_EN, and output a driving signal to the external sub-circuit according to the red PWM signal R_PWM when the enable signal R_EN is at the effective potential, so that the external sub-circuit adjusts output voltages of the positive output LD3+ and the negative output LD3− of the external sub-circuit according to the driving signal. As a result, the output voltages of the positive output LD3+ and the negative output LD3− meet the requirement of the driving voltage of the red laser chips 101.

Figure 14:
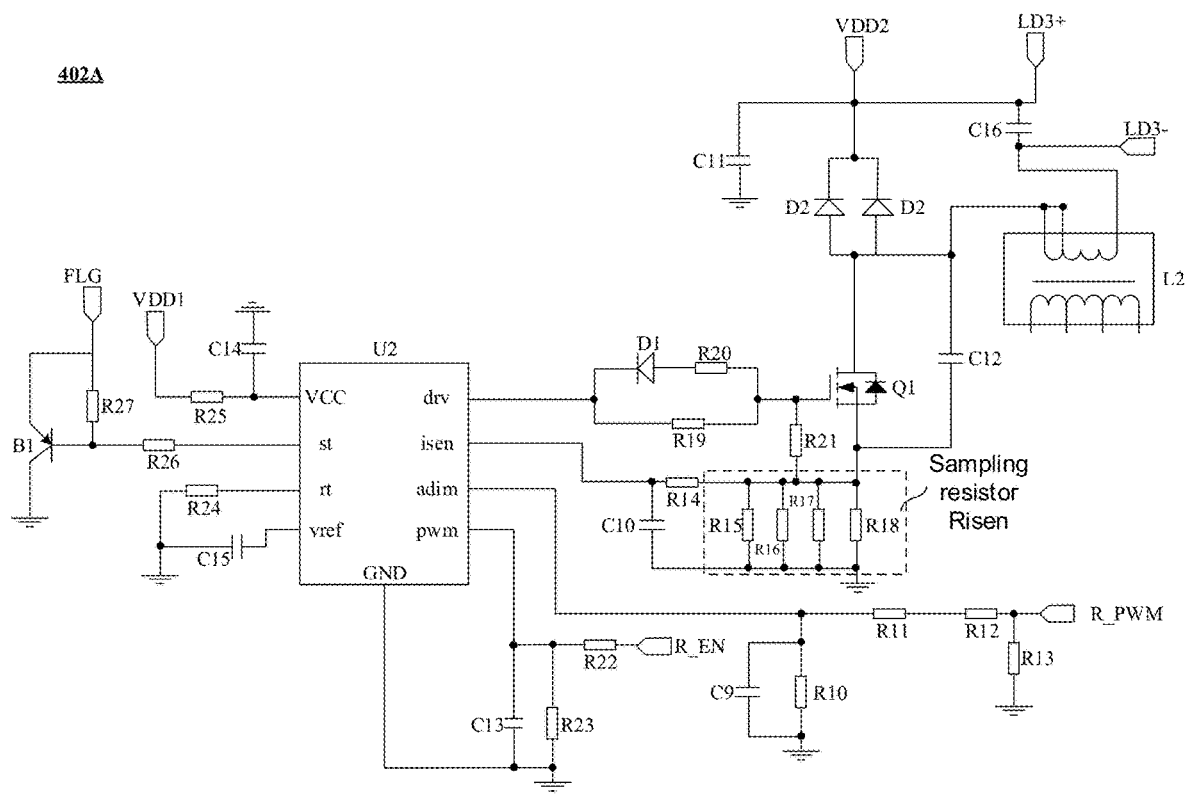
FIG. 14 is a schematic diagram showing a specific structure of the first laser chip driving circuit in FIG. 13.

As shown in FIGS. 13 and 14, the driving chip U2 includes an rt pin, a drv pin (i.e., an output of U2), an adim pin (i.e., a first input of U2), a pwm pin (i.e., a second input of U2), and an isen pin (i.e., a third input of U2).

Figure 15:
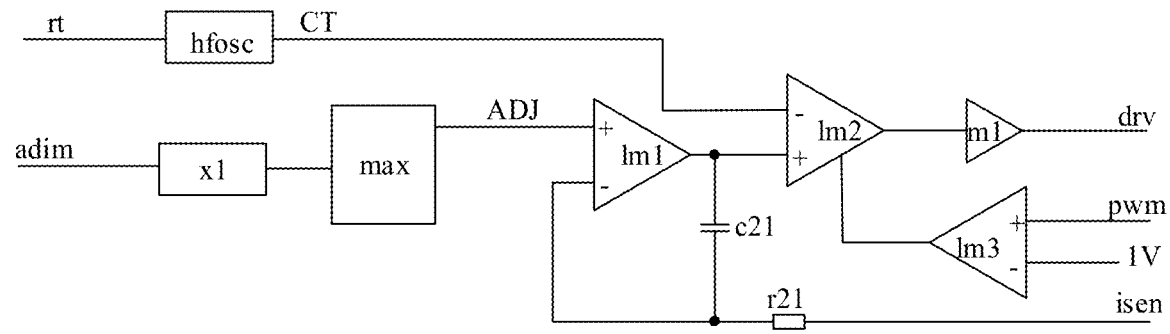
FIG. 15 is a schematic diagram showing a structure of a driving chip in FIG. 13.

FIG. 15 is an internal circuit diagram of the driving chip U2. As shown in FIG. 15, the driving chip U2 further includes a divider x1, a switching frequency square wave generator hfosc, a voltage limiter max, a comparator Im1, a comparator Im2, a comparator Im3 and a buffer m1.

The divider x1 is configured to reduce the voltage at the adim pin. The comparator Im1 is configured to compare the voltage reduced by the divider x1 with the voltage at the isen pin. The comparator Im3 is configured to compare whether the voltage at the pwm pin exceeds 1V. The comparator Im2 is configured to compare a square wave signal value of the switching frequency square wave generator hfosc with an output signal value of the comparator Im1 when the voltage at the pwm pin exceeds 1V, so as to adjust the duty cycle of the driving signal output by the drv pin, and adjust the voltage at the isen pin through the external sub-circuit.

It should be understood that, when the voltage at the adim pin that is reduced by the divider x1 and the voltage at the isen pin are basically equal, the duty cycle of the driving signal output by the drv pin tends to be stable, so that the voltage at the isen pin is stable. The first laser chip driving circuit 402A outputs a stable driving voltage through the positive output LD3+ and the negative output LD3−. In addition, in order to prevent an excessive driving voltage output by the first laser chip driving circuit 402A from damaging the red laser chips 101, the voltage limiter max may be used to limit the stable voltage at the isen pin in the driving chip U2.

As shown in FIGS. 13 and 14, the adim pin of the driving chip U2 is configured to receive the red PWM signal R_PWM. In order to match the red PWM signal R_PWM with the rated voltage at the adim pin of the driving chip U2, the adim pin may be connected to the R_PWM output of the display control circuit 401 through a voltage divider resistor, so as to divide the voltage of the received red PWM signal R_PWM through the voltage divider resistor. The voltage divider resistor may include a resistor R10, a resistor R11, and a resistor R12. The adim pin may be connected to the R_PWM output of the display control circuit 401 through the resistor R11 and the resistor R12 connected in series. The adim pin is also grounded through the resistor R10.

In this way, a voltage $U_{adim}$ at the adim pin of the driving chip U2 may meet the following formula:

$$U_{adim}[mV] = \frac{R10}{R10 + R11 + R12} \times U_{R\_PWM}[mV].$$

$U_{R\_PWM}$ is the voltage of red PWM signal R_PWM received by the laser chip driving circuit 402A in millivolt.

It can be seen from the above description that when the voltage at the isen pin is stable, the voltage at the isen pin is equal to the voltage reduced by the divider x1 at the adim pin. Therefore, a voltage $U_{isen}$ at the isen pin may meet the following formula:

$$U_{isen}[mV] = \frac{U_{adim}[mV]}{k}.$$

k is a reduction coefficient of the divider x1 in the driving chip U2.

In order to ensure the stability of the R_PWM signal, a connection terminal of the resistor R12 that connects the R_PWM output of the display control circuit 401 is also connected with a pull-down resistor R13. In order to filter and shape the red PWM signal R_PWM, the adim pin may also be grounded through the capacitor C9.

The pwm pin of the driving chip U2 is connected to the R_EN output of the display control circuit 401, and is configured to receive the enable signal R_EN corresponding to the red laser chips 101. In order to filter and shape the enable signal R_EN, as shown in FIG. 13, the pwm pin is connected to the R_EN output of the display control circuit 401 through a resistor R22, and is grounded through a capacitor C13 and a resistor R23 connected in parallel.

The drv pin of the driving chip U2 is configured to output a driving signal to the external sub-circuit, so that the external sub-circuit adjusts a driving voltage output to the external sub-circuit and the voltage at the isen pin according to the duty cycle of the driving signal.

The isen pin of the driving chip U2 is configured to connect the external sub-circuit and receive a feedback voltage of the external sub-circuit (i.e., the voltage at the isen pin), so that the driving chip U2 adjusts the duty cycle of the driving signal output to the external sub-circuit according to the voltage at the isen pin and the voltage at the adim pin when the received enable signal R_EN is at the effective potential.

As shown in FIG. 14, the external sub-circuit includes a power supply VDD2, a transformer L2, a switching field effect transistor Q1, and a sampling resistor Risen. The power supply VDD2 is a power supply provided by the first laser chip driving circuit 402A. One end of the sampling resistor Risen is connected to the isen pin of the driving chip U2 and a source of the switching field effect transistor Q1, and the other end of the sampling resistor Risen is grounded. A gate of the switching field effect transistor Q1 is connected to the drv pin of the driving chip U2, and a drain of the switching field effect transistor is connected to the power supply VDD2. The source of the switching field effect transistor Q1 is also connected to the negative output LD3− through the transformer L2.

In this way, the driving chip U2 adjusts the duty cycle of the driving signal output by the drv pin according to the voltage at the isen pin when the received enable signal R_EN is at the effective potential, so as to control a switching state of the switching field effect transistor Q1. As a result, the switching field effect transistor Q1 is connected to the power supply VDD2 and one end of the transformer L2 in a conductive state thereof. Moreover, an output voltage of the negative output LD3− is changed through the transformer L2, and in turn a current on the sampling resistor Risen (i.e., a driving current input to the red laser chips 101) and the voltage at the isen pin are changed.

When the duty cycle of the driving signal output by the drv pin no longer changes, the driving signal output by the drv pin tends to be stable. At this time, the output voltage of the negative output LD3- and the current on the sampling resistor Risen tend to be stable, and the first laser chip driving circuit 402A outputs a stable driving voltage and a stable driving current to the red laser chips 101.

It should be understood that, a driving current $I_{laser}$ (in milliamps) provided by the first laser chip driving circuit 402A to the red laser chips may be $$I_{laser}[mA] = \frac{U_{adim}[mV]}{k \times R_{isen}[\Omega]}.$$

k is a reduction coefficient of the divider x1 in the driving chip U2. Risen is the sampling resistance in ohms. As shown in FIG. 12, the sampling resistor Risen includes a resistor R15, a resistor R16, a resistor R17, and a resistor R18 that are connected in parallel. The Risen in the above formula is a resistance value formed by connecting the resistor R15, the resistor R16, the resistor R17 and the resistor R18 in parallel, and may be expressed as $R_{isen}$=R15//R16//R17//R18. "//" indicates the parallel connection.

The rt pin of the driving chip U2 may be grounded through a resistor R24. A frequency of the driving signal output by the drv pin of the driving chip U2 is determined by a resistance value of the resistor R24. That is, a switching frequency of the switching field effect transistor Q1 may be determined by the resistance of the resistor R24.

In addition, as shown in FIG. 14, the drv pin of the driving chip U2 may be connected to the gate of the switching field effect transistor Q1 through a shaping circuit. The shaping circuit may include a diode D1, a resistor R19, and a resistor R20. The diode D1 is connected in series with the resistor R20 and then connected in parallel with the resistor R19, and a cathode of the diode is connected to the drv pin. Through the shaping circuit, a slope of a rising edge or a falling edge of the driving signal output by the drv pin may be adjusted, so that the slope of the rising edge or the falling edge of the driving signal output by the drv pin is gentler.

For example, as shown in FIG. 14, a diode combination is also provided between the power supply VDD2 and the transformer L2, and the diode combination is also connected between the power supply VDD2 and the drain of the switching field effect transistor Q1. The diode combination is configured to conduct the power supply VDD2 to the transformer L2 when the switching field effect transistor Q1 is conducted, and discharge the driving current flowing to the transformer L2 when the switching field effect transistor Q1 is turned off. The diode combination includes two diodes D2 connected in parallel. An anode of each diode D2 is connected to the drain of the switching field effect transistor Q1, and a cathode of each diode D2 is connected to the power supply.

As shown in FIG. 14, a capacitor C16 is also connected between the positive output LD3+ and the negative output LD3−. The capacitor C16 matches a capacitance characteristic of the red laser chips 101.

For example, as shown in FIG. 14, the driving chip U2 further includes a VCC pin, an st pin, a vref pin, and a GND pin.

The VCC pin of the driving chip U2 is connected to a power supply VDD1. The st pin of the driving chip U2 may be connected to an alarm terminal FLG through a transistor B1. For example, the st pin is connected to a base of the transistor B1 through a resistor R26, the alarm terminal FLG is connected to the base of the transistor B1 through a resistor R27, an emitter of the transistor B1 is connected to the alarm terminal FLG, and a collector of the transistor B1 is grounded. The alarm terminal FLG is configured to output an alarm signal to an external power supply circuit connected to the power supply pin VCC of the driving chip U2 when the first laser chip driving circuit 402A generates an abnormal current, so that the external power supply circuit stops supplying power to the driving chip U2. The vref pin of the driving chip U2 may be grounded through a capacitor C15. The GND pin of the driving chip U2 is grounded.

It can be seen from the above description of the driving chip U2 that, the enable signal R_EN corresponding to the red laser chips 101 input by the pwm pin of the driving chip U2 is the enable signal of the driving chip U2. In a case where the enable signal R_EN is at the effective potential, the driving chip U2 operates normally. The driving chip U2 may adjust the duty cycle of the driving signal output by the drv pin according to a voltage of the R_PWM signal input by the adim pin and the voltage of the isen pin, so as to adjust the output voltage of the negative output LD3− through an external sub-circuit. As a result, the adjustment of the driving voltage applied to the red laser chips 101 is achieved, and the red laser chips 101 operate at a constant current. When the enable signal R_EN is at an ineffective potential, the driving chip U2 stops operating, and the red laser chips 101 do not emit laser beams.

It should be understood that the structure of the first laser chip driving circuit 402A shown in FIG. 14 is only an example. In the actual implementation process, a circuit structure of the first laser chip driving circuit 402A may be adaptively adjusted under the condition that the basic function is met. Therefore, the circuit structure of the first laser chip driving circuit 402A shown in FIG. 14 does not limit the structure of the laser chip driving circuit in the embodiments of the present disclosure.

Figure 16:
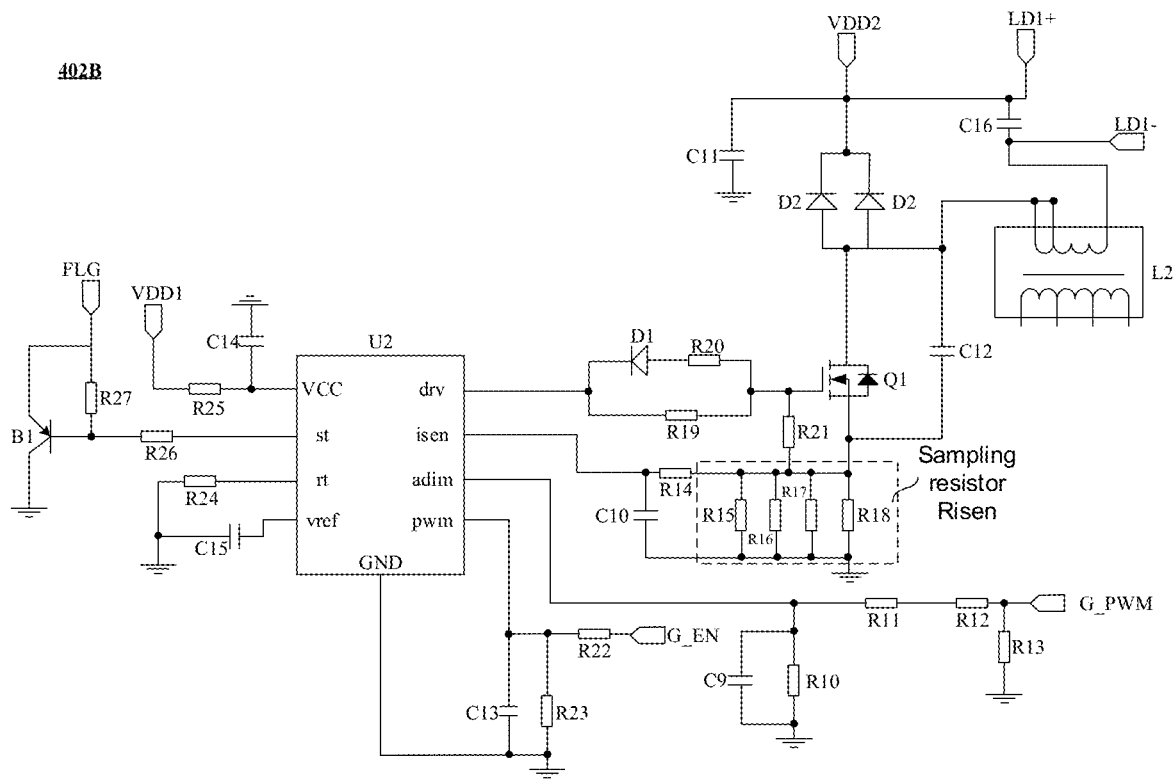
FIG. 16 is a schematic diagram showing a structure of a second laser chip driving circuit, in accordance with some embodiments.
Figure 17:
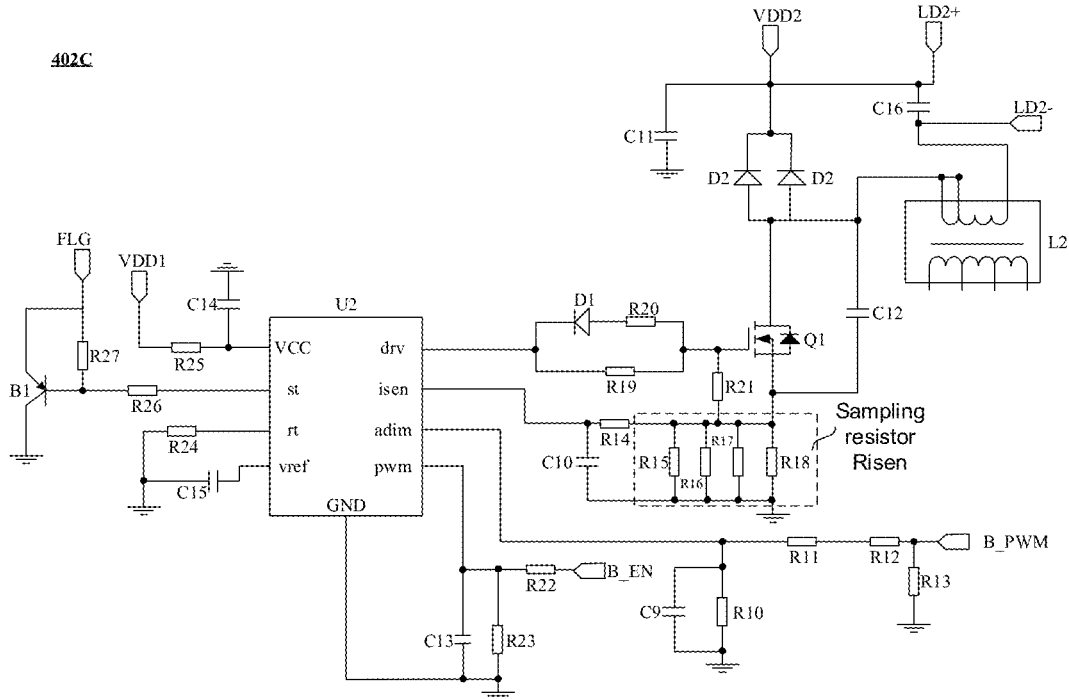
FIG. 17 is a schematic diagram showing a structure of a third laser chip driving circuit, in accordance with some embodiments.

FIG. 16 is a structure of the second laser chip driving circuit 402B corresponding to the green laser chips 102, a positive output LD1+ in FIG. 16 may be connected to the pin 4 of the green laser chips 102, and a negative output LD1− may be connected to the pin 5 of the green laser chips 102. FIG. 17 is a structure of the third laser chip driving circuit 402C corresponding to the blue laser chips 103, a positive output LD2+ in FIG. 17 may be connected to the pin 6 of the blue laser chips 103, and a negative output LD2− may be connected to the pin 7 of the blue laser chips 103. In some embodiments, the second laser chip driving circuit 402B and the third laser chip driving circuit 402C have the same structure, connection relationship and operation principle as the first laser chip driving circuit 402A, which will not be repeated here.

In summary, in the laser projection apparatus provided by some embodiments of the present disclosure, the display control circuit 401 may generate the PWM signal and the enable signal corresponding to the laser chips of each color, and may transmit the generated PWM signal and enable signal to the laser chip driving circuit of the corresponding color. The laser chip driving circuit of the corresponding color may output the driving voltage according to the received PWM signal and enable signal, and apply the driving voltage to the pins of the laser chips of the corresponding color, so as to drive the laser chips of each color to emit laser beams, thereby achieving an independent control of the laser chips of each color. In addition, in the laser projection apparatus provided by some embodiments of the present disclosure, the brightness of the laser beams emitted from the laser chips of the three colors may be adjusted according to the components of the three primary colors in each frame of image, which can avoid the waste of the laser source and reduce the power consumption of the apparatus.

Generally, the PWM signal generated by the display control circuit 401 is a digital signal. In order to make the laser chip driving circuits 402A, 402B and 402C respond faster, the PWM signal generated by the display control circuit 401 may be converted into an analog PWM signal, and the analog PWM signal may be input to the laser chip driving circuits 402A, 402B, and 402C.

Figure 18A:
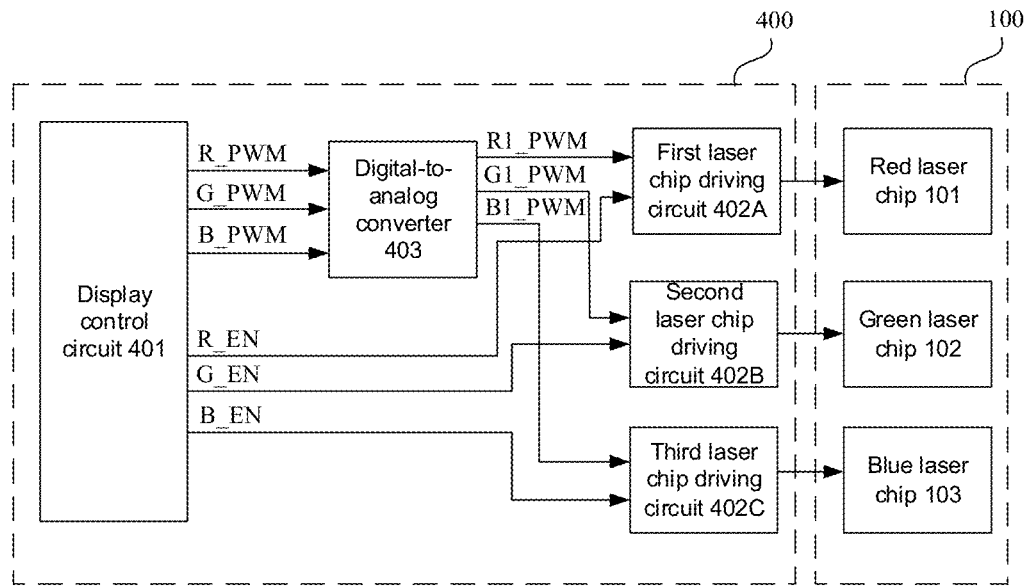
FIGS. 18A and 18B are diagrams of two other different circuit system architectures of a laser projection apparatus, in accordance with some embodiments.
Figure 18B:
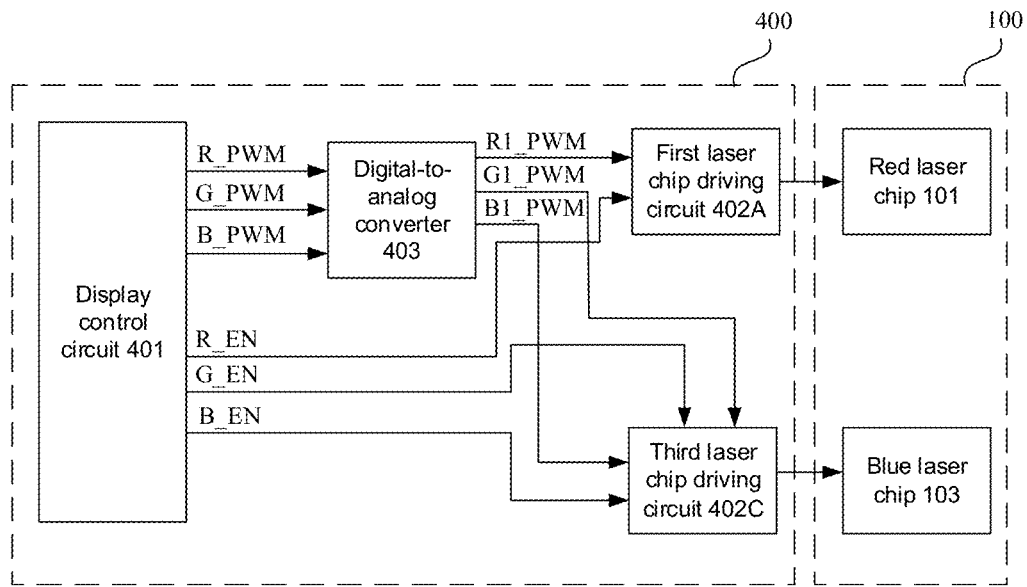

In some embodiments of the present disclosure, as shown in FIG. 18A, the circuit system architecture 400 may further include a digital-to-analog converter (DAC) 403. Inputs of the DAC 403 are connected to the display control 401, and outputs of the DAC 403 are connected to the laser chip driving circuits 402A, 402B, and 402C.

The DAC 403 is configured to receive the PWM signals generated by the display control circuit 401, convert each received PWM signal into a corresponding analog signal, and transmit the corresponding analog signals to the laser chip driving circuits 402A, 402B, and 402C.

Figure 19:
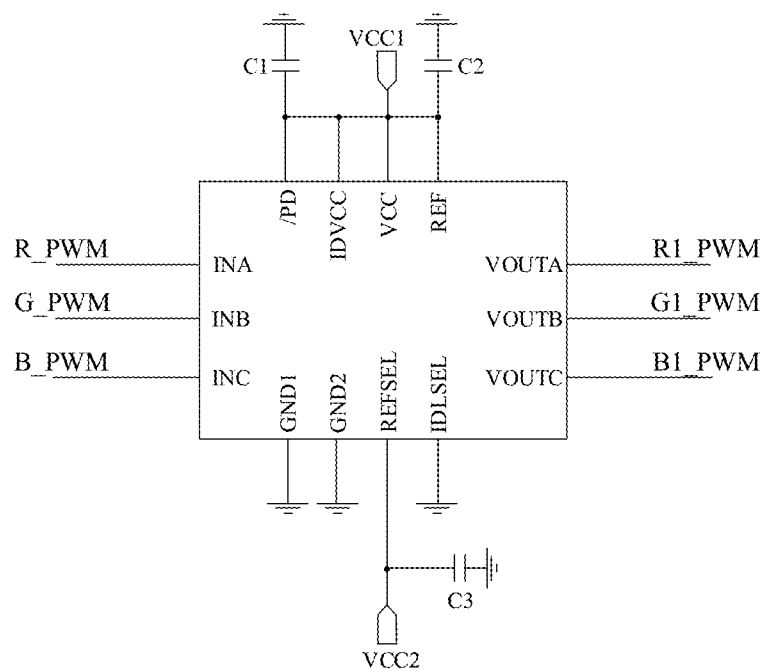
FIG. 19 is a schematic diagram showing a structure of a digital-to-analog converter in FIG. 18A.

For example, as shown in FIG. 19, the DAC 403 has at least three input pins (i.e., inputs), which are an INA pin, an INB pin, and an INC pin. The DAC 403 has at least three output pins (i.e., outputs), which are a VOUTA pin, a VOUTB pin, and a VOUTC pin.

The INA pin, the INB pin and the INC pin are all connected to the display control circuit 401, and are respectively configured to receive the red PWM signal R_PWM, the green PWM signal G_PWM and the blue PWM signal B_PWM output by the display control circuit 401. The red PWM signal R_PWM, the green PWM signal G_PWM and the blue PWM signal B_PWM are all digital signals.

The VOUTA pin is connected to the first laser chip driving circuit 402A, and is configured to output an analog signal R1_PWM (i.e., a first analog PWM signal) obtained by converting from the red PWM signal R_PWM (i.e., the first PWM signal) to the first laser chip driving circuit 402A. The VOUTB pin is connected to the second laser chip driving circuit 402B, and is configured to output an analog signal G1_PWM (i.e., a second analog PWM signal) obtained by converting from the green PWM signal G_PWM (i.e., the second PWM signal) to the second laser chip driving circuit 402B. The VOUTC pin is connected to the third laser chip driving circuit 402C, and is configured to output an analog signal B1_PWM (i.e., a third analog PWM signal) obtained by converting from the blue PWM signal B_PWM (i.e., the third PWM signal) to the third laser chip driving circuit 402C.

It should be understood that at this time, the R_PWM signal, G_PWM signal, and B_PWM signal received by the laser chip driving circuits 402A, 402B, and 402C shown in FIG. 11A have been converted into the analog signal R1_PWM, the analog signal G1_PWM and the analog signal B1_PWM, respectively. The analog signal R1_PWM, the analog signal G1_PWM and the analog signal B1_PWM are all analog direct current (DC) voltage signals, which makes the laser chip driving circuits respond faster and reduce the delay after receiving the analog PWM signal.

In addition, in order to make the DAC 403 operate normally, the DAC 403 may further include a/PD pin, an IDVCC pin, a VCC pin, a REF pin, a GND1 pin, a GND2 pin, a REFSEL pin, and an IDLSEL pin. For example, the/PD pin, the IDVCC pin, the VCC pin, and the REF pin are all grounded through a capacitor C1 and a capacitor C2 connected in parallel, and are all connected to a power supply terminal VCC1. The GND1 pin, the GND2 pin and the IDLSEL pin are all grounded, the REFSEL pin is connected to a power supply terminal VCC2 and one end of a capacitor C3, and the other end of the capacitor C3 is grounded. For example, voltages provided by the power supply terminal VCC1 and the power supply terminal VCC2 may both be 5V (volts). Parameters of the capacitor C1, the capacitor C2 and the capacitor C3 are all 100 nF (nanofarad)/16V (i.e., capacitances of the capacitor C1, the capacitor C2 and the capacitor C3 are all 100 nF, and the rated voltage thereof is 16V.)

In this way, by adding the DAC 403, a digital PWM signal can be converted into an analog PWM signal. As a result, the response speed of the laser chip driving circuit is improved, and the signal delay and response delay are reduced.

It can be seen from the above description that the laser chip driving circuits 402A, 402B, and 402C operate only when the corresponding enable signals are at the effective potential. However, in the circuit system architecture 400 in FIG. 11A or FIG. 18A, when the corresponding enable signal is a non-effective potential (which may also be referred to as an ineffective potential, e.g., a low level), the PWM signals generated by the display control circuit 401 are also input to the laser chip driving circuits 402A, 402B, and 402C. As a result, the laser chip driving circuits and the laser projection apparatus 10 have large power consumption.

Figure 20A:
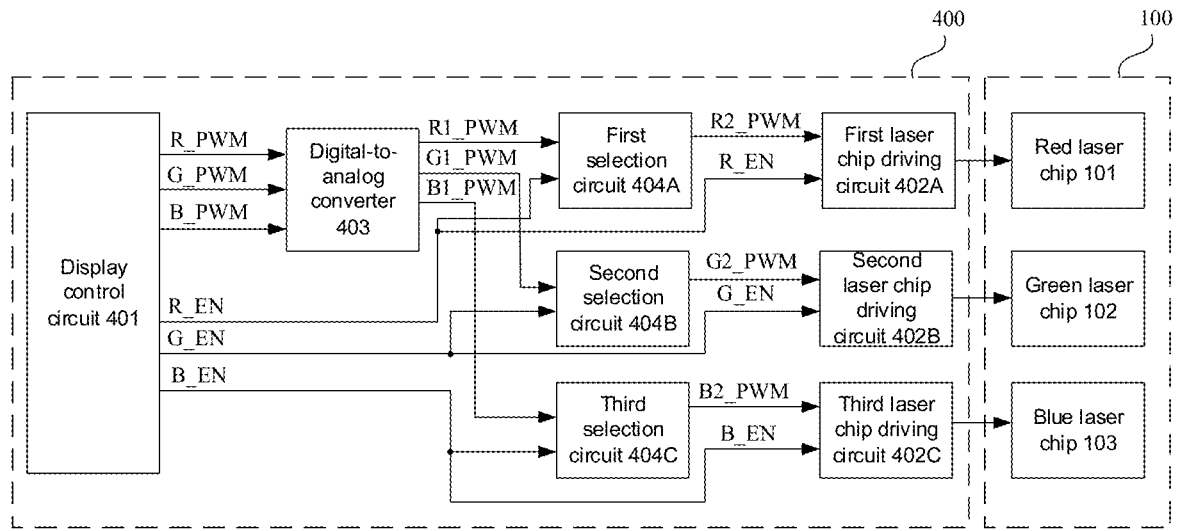
FIGS. 20A and 20B are diagrams of two other different circuit system architectures of a laser projection apparatus, in accordance with some embodiments.
Figure 20B:
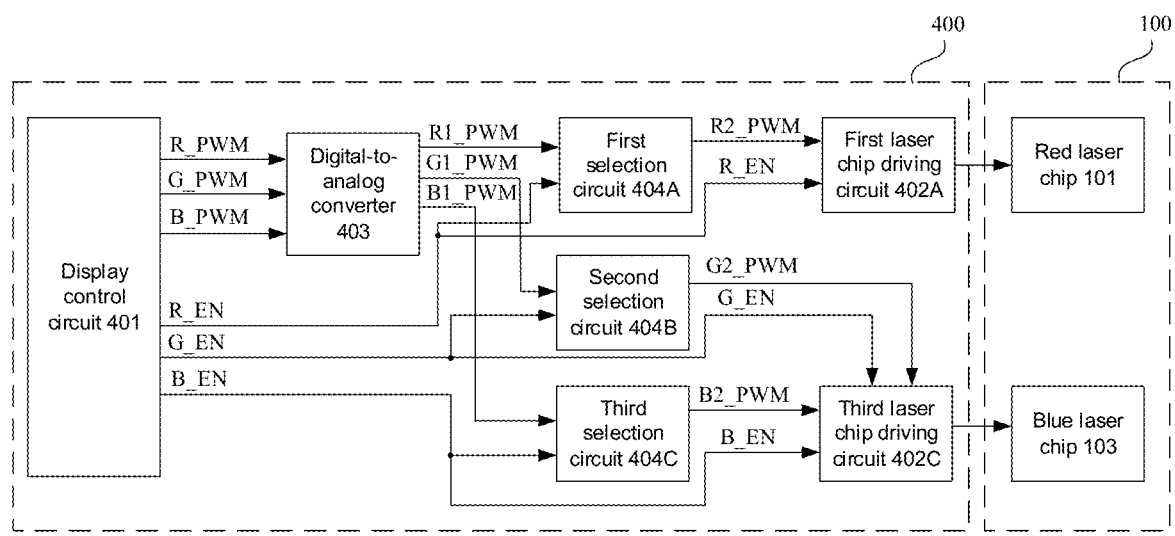

In some embodiments, in order to reduce the power consumption of the laser projection apparatus 10, as shown in FIG. 20A, the circuit system architecture 400 may further include selection circuits 404A, 402B, and 404C corresponding to the laser chips of the three primary colors.

Two inputs of a first selection circuit 404A are connected to the output of the DAC 403 and the output of the display control circuit 401, and are configured to receive the analog signal R1_PWM output by the DAC 403 and the enable signal R_EN output by the display control circuit 401. An output of the first selection circuit 404A is connected to the input of the first laser chip driving circuit 402A, and is configured to transmit the received analog signal R1_PWM to the first laser chip driving circuit 402A when the received enable signal R_EN is at the effective potential. As a result, the first laser chip driving circuit 402A applies the driving voltage (or driving current) on the pins of the red laser chips 101 according to the voltage of the received analog signal R2_PWM (the analog signal R2_PWM and the analog signal R1_PWM are the same signal, and they are just named differently), which makes the red laser chips 101 emit red laser beams.

Two inputs of a second selection circuit 404B are connected to the output of the DAC 403 and the output of the display control circuit 401, and are configured to receive the analog signal G1_PWM output by the DAC 403 and the enable signal G_EN output by the display control circuit 401. An output of the second selection circuit 404B is connected to the input of the second laser chip driving circuit 402B, and is configured to transmit the received analog signal G1_PWM to the second laser chip driving circuit 402B when the received enable signal G_EN is at the effective potential. As a result, the second laser chip driving circuit 402B applies the driving voltage (or driving current) on the pins of the green laser chips 102 according to the voltage of the received analog signal G2_PWM (the analog signal G2_PWM and the analog signal G1_PWM are the same signal, and they are just named differently), which makes the green laser chips 102 emit green laser beams.

Two inputs of a third selection circuit 404C are connected to the output of the DAC 403 and the output of the display control circuit 401, and are configured to receive the analog signal B1_PWM output by the DAC 403 and the enable signal B_EN output by the display control circuit 401. An output of the third selection circuit 404C is connected to the input of the third laser chip driving circuit 402C, and is configured to transmit the received analog signal B1_PWM to the third laser chip driving circuit 402C when the received enable signal B_EN is at the effective potential. As a result, the third laser chip driving circuit 402C applies the driving voltage (or driving current) on the pins of the blue laser chips 103 according to the voltage of the received analog signal B2_PWM (the analog signal B2_PWM and the analog signal B1_PWM are the same signal, and they are just named differently), which makes the blue laser chips 103 emits blue laser beams.

Figure 21:
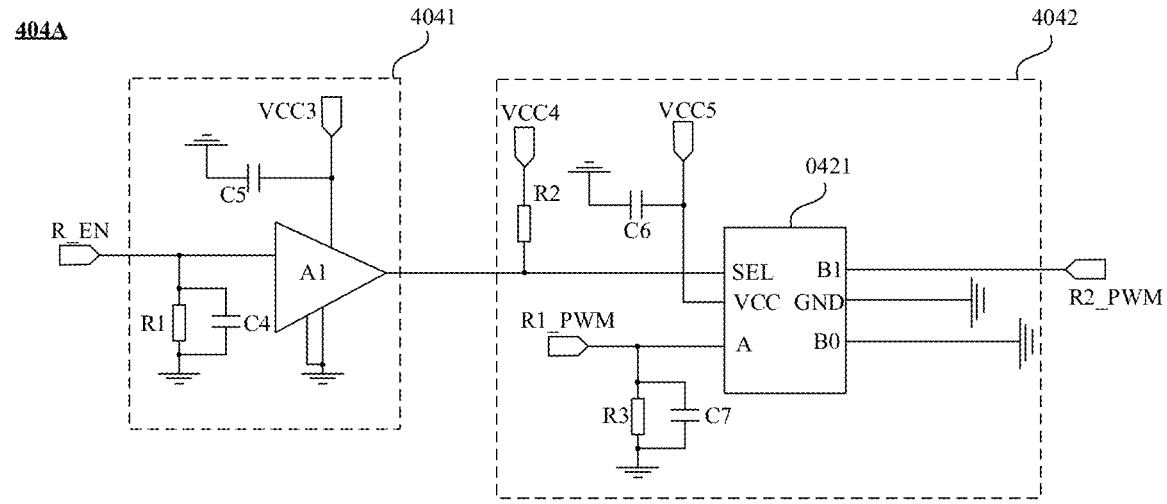
FIG. 21 is a schematic diagram showing a structure of a first selection circuit in FIG. 20A.

In the following, the structure of the selection circuit will be described by taking the first selection circuit 404A corresponding to the red laser chips 101 as an example. As shown in FIG. 21, the first selection circuit 404A includes an adaptation sub-circuit 4041 and a selection sub-circuit 4042.

The adaptation circuit 4041 is connected to the display control circuit 401, and is configured to receive the enable signal R_EN generated by the display control circuit 401, and converts a voltage of the received enable signal R_EN to a rated voltage of the selection sub-circuit 4042.

The selection sub-circuit 4042 is connected to the adaptation sub-circuit 4041 and the DAC 403, and is configured to receive the enable signal R_EN after voltage conversion by the adaptation sub-circuit 4041 and the analog signal R1_PWM output by the DAC 403. The selection sub-circuit 4042 transmits the received analog signal R1_PWM to the first laser chip driving circuit 402A when the received enable signal R_EN is at the effective potential. In this case, the analog signal R1_PWM is renamed as the analog signal R2_PWM.

For example, referring to FIG. 21, the adaptation circuit 4041 includes an operational amplifier A1. The operational amplifier A1 is configured to receive the enable signal R_EN and convert the voltage of the enable signal R_EN into a rated voltage (e.g., 5V) of the selection sub-circuit 4042. For example, if a corresponding voltage of the enable signal R_EN when being at the effective potential (e.g., a high level) is 3.5V, and the rated voltage of the selection sub-circuit 4042 is 5V, the operational amplifier A1 may convert the voltage of the enable signal R_EN from 3.5V to 5V.

For example, the operational amplifier A1 has at least a first input, a second input, a power supply terminal, a ground terminal and an output. The first input may be a non-inverting input, is connected to the display control circuit 401, and is configured to receive the enable signal R_EN. The first input is also connected with a filter circuit. In a case where the received enable signal R_EN contains spurs, or the ripple of the enable signal R_EN is large, the filter circuit may be used to filter the spurs of the enable signal R_EN, or filter a portion of the enable signal R_EN with large ripple. The filter circuit may be composed of a resistor R1 and a capacitor C4 connected in parallel. That is, one end of the resistor R1 and the capacitor C4 that are in parallel is connected to the first input, and the other end thereof is grounded. The second input may be an inverting input, which is connected to the ground terminal and is grounded. The power supply terminal may be connected to the power supply VCC3. The power supply terminal is connected to one end of the capacitor C5, and the other end of the capacitor C5 is grounded. The output is connected to the selection sub-circuit 4042.

It should be understood that, in a case where the corresponding voltage of the enable signal R_EN when it is at the effective potential (e.g., the high level) is equal to the rated voltage of the selection sub-circuit 4042, the first selection circuit 404A may not include the adaptation sub-circuit 4041, and the enable signal R_EN may be directly input to the selection sub-circuit 4042.

In addition, the adaptation sub-circuit 4041 shown in FIG. 21 is only an example, and it may be adjusted when the same function is met in the actual circuit.

For example, referring to FIG. 21, the selection sub-circuit 4042 includes a switching converter 0421. The switching converter 0421 may include one input (i.e., an A pin), two outputs (i.e., a B0 pin and a B1 pin), an enable terminal (i.e., an SEL pin), a power pin VCC, and a ground pin GND.

The SEL pin is connected to the output of the operational amplifier A1, and is configured to receive the enable signal R_EN after level conversion. The A pin is connected to the output (VOUTA pin) of the DAC 403, and is configured to receive the analog signal R1_PWM. The switching converter 0421 is configured to output the analog signal R1_PWM through the B1 pin which is input by the A pin when the enable signal R_EN input by the SEL pin is at the effective potential (at this time, the analog signal R1_PWM is renamed as the analog signal R2_PWM), thereby achieving the synchronization of the enable signal and the PWM signal. The switching converter 0421 is also configured not to output the analog signal R1_PWM when the enable signal R_EN input by the SEL pin is at the ineffective potential (i.e., a low potential or a low level).

In order to filter and shape the received analog signal R1_PWM, the A pin is also grounded through a resistor R3 and a capacitor C7 connected in parallel. In a case where the analog signal R1_PWM contains spurs, or the ripple of the analog signal R1_PWM is large, the resistor R3 and the capacitor C7 are configured to filter the spurs of the analog signal R1_PWM, or filter a portion of the analog signal R1_PWM with large ripple.

The B1 pin (i.e., the first output) is connected to the first laser chip driving circuit 402A, and is configured to provide a selected red PWM analog signal R2_PWM for the first laser chip driving circuit 402A. Both the GND pin and the B0 pin are grounded.

In order to ensure the stability of an SEL pin signal, usually, a pull-up resistor R2 may be connected to the SEL pin, and the pull-up resistor is connected to a power supply VCC4. The power supply VCC4 may have the same voltage as the power supply VCC3 and a power supply VCC5.

Figure 22:
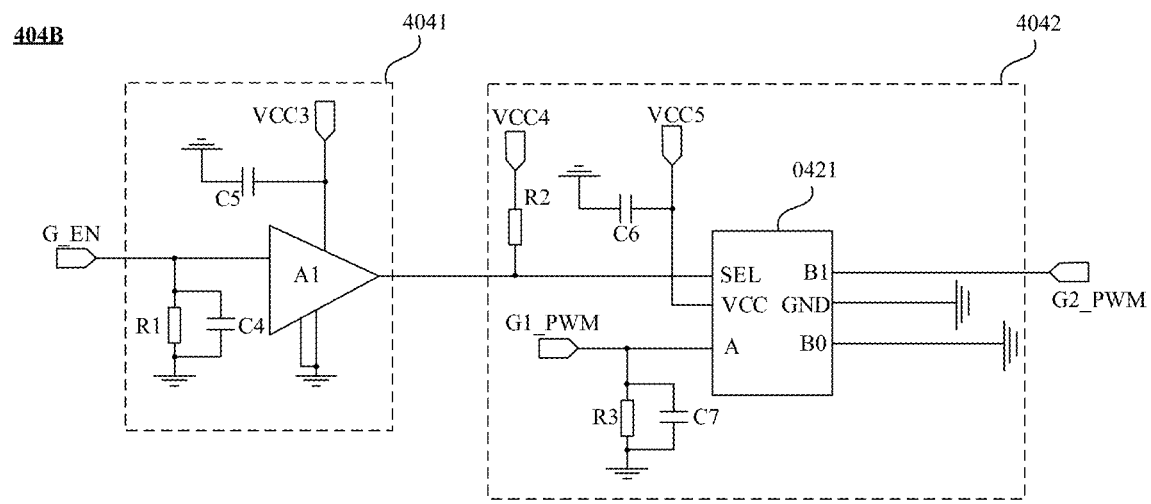
FIG. 22 is a schematic diagram showing a structure of a second selection circuit in FIG. 20A.
Figure 23:
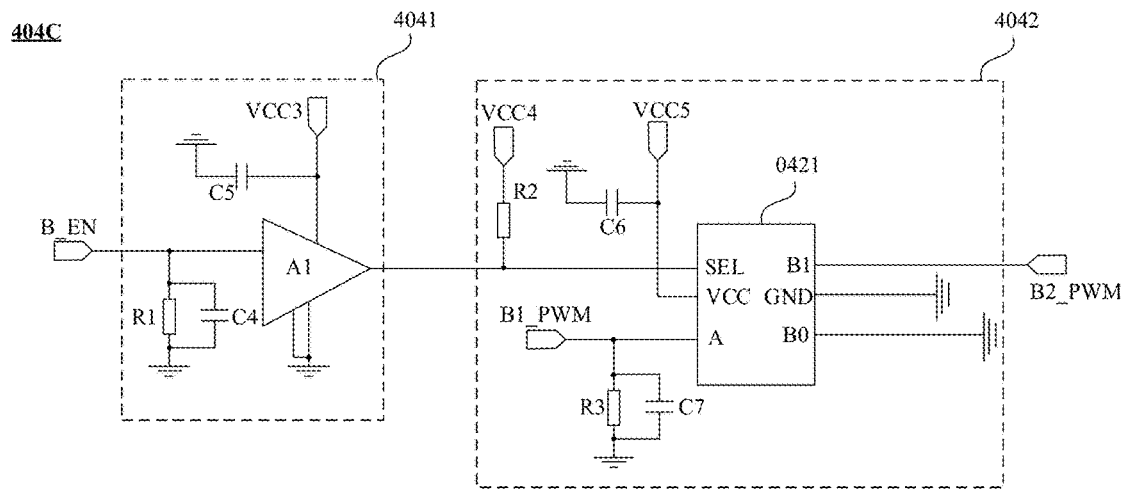
FIG. 23 is a schematic diagram showing a structure of a third selection circuit in FIG. 20A.

FIG. 22 is a schematic diagram showing the structure of the second selection circuit 404B corresponding to the green laser chips 102. FIG. 23 is a schematic diagram showing the structure of the third selection circuit 404C corresponding to the blue laser chips 103. The structure and the connection relationship of the second selection circuit 404B and the third selection circuit 404C may be referred to the first selection circuit 404A shown in FIG. 21, which will not be repeated here.

In addition, in the circuit system architecture 400 shown in FIG. 20A, there may be no DAC 403. That is, the selection circuits 404A, 404B, and 404C respectively correspond to the laser chip driving circuits 402A, 402B, and 402C are added on the basis of FIG. 11A.

In some situations, a power supply voltage of the display control circuit 401 may be inconsistent with power supply voltages of the laser chip driving circuits 402A, 402B, and 402C or an operating voltage of the DAC 403 at the back end. In this case, the PWM signals and the enable signals output by the display control circuit 401 need to be subjected to voltage conversion and then input to the laser chip driving circuits 402A, 402B, and 402C or the DAC 403.

Figure 24A:
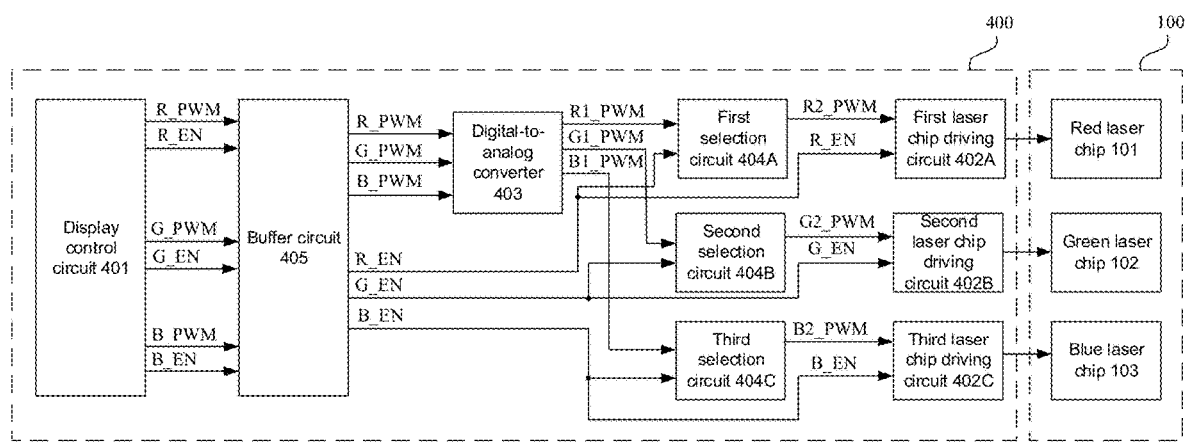
FIGS. 24A and 24B are diagrams of two other different circuit system architectures of a laser projection apparatus, in accordance with some embodiments.
Figure 24B:
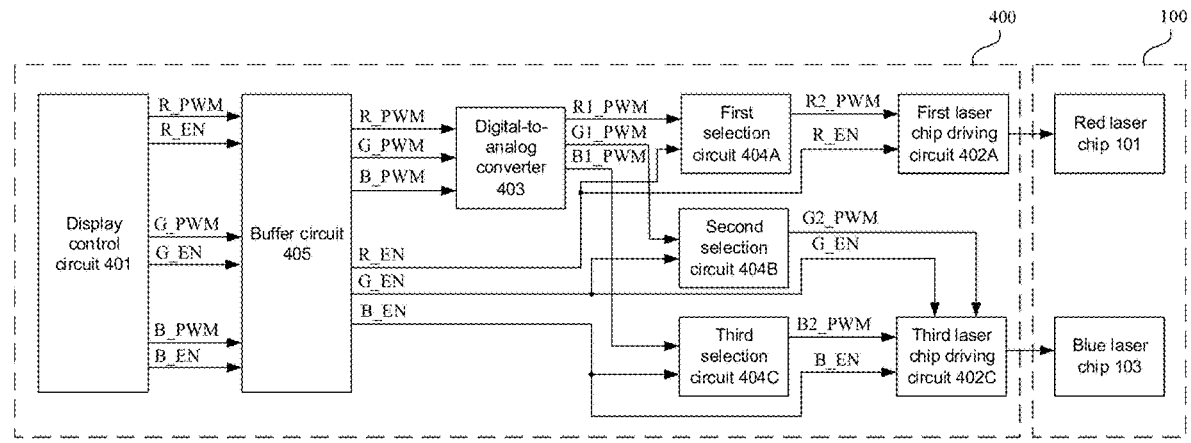

In some embodiments, as shown in FIG. 24A, the circuit system architecture 400 may further include a buffer circuit 405. The buffer circuit 405 is configured to output the PWM signals and the enable signals output by the display control circuit 401 after voltage conversion.

For example, as shown in FIG. 24A, inputs of the buffer circuit 405 are connected to the outputs of the display control circuit 401, and are configured to receive the PWM signals and the enable signals output by the display control circuit 401. A part of the outputs of the buffer circuit 405 are connected to the inputs of the DAC 403, and are configured to output the PWM signals after voltage conversion to the DAC 403, so that the DAC 403 converts the digital PWM signals into the analog PWM signals. The other part of the outputs of the buffer circuit 405 are connected to the selection circuits 404A, 404B and 404C, and are configured to output the enable signals after voltage conversion to the selection circuits 404A, 404B, and 404C.

Figure 25:
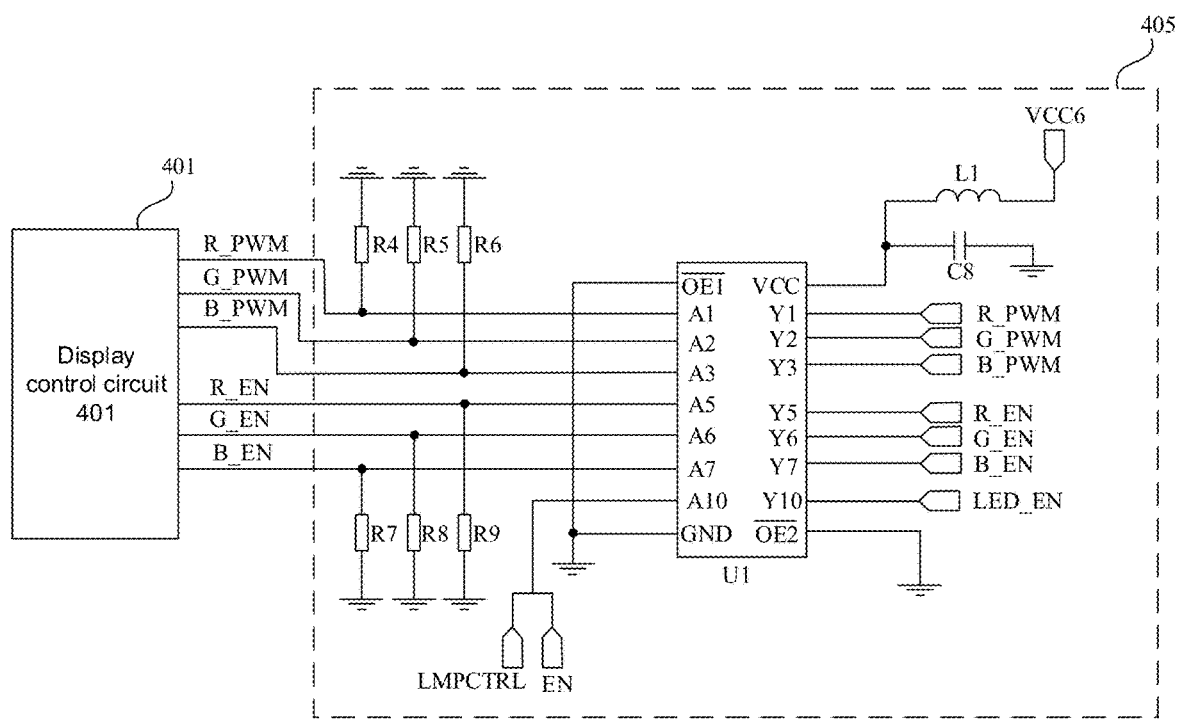
FIG. 25 is a schematic diagram showing a structure of a buffer circuit in FIG. 24A.

For example, as shown in FIG. 25, the buffer circuit 405 includes a Buffer chip U1. The Buffer chip U1 includes seven input pins, which are A1 to A3 pins (i.e., PWM inputs), A5 to A7 pins (i.e., enable inputs), and an A10 pin, and seven output pins which are Y1 to Y3 pins (i.e., PWM outputs), Y5 to Y7 pins (i.e., enable outputs), and a Y10 pin.

The A1 pin is connected to the R_PWM output of the display control circuit 401, and is configured to receive the red PWM signal R_PWM. The A2 pin is connected to the G_PWM output of the display control circuit 401, and is configured to receive the green PWM signal G_PWM. The A3 pin is connected to the B_PWM output of the display control circuit 401, and is configured to receive the blue PWM signal B_PWM.

The A5 pin is connected to the R_EN output of the display control circuit 401, and is configured to receive the enable signal R_EN. The A6 pin is connected to the G_EN output of the display control circuit 401, and is configured to receive the enable signal G_EN. The A7 pin is connected to the B_EN output of the display control circuit 401, and is configured to receive the enable signal B_EN.

The Y1 pin is connected to the INA pin of the DAC 403 and is configured to transmit the red PWM signal R_PWM after voltage conversion to the DAC 403, so that the DAC 403 converts the digital signal R_PWM into the analog signal R1_PWM. The Y2 pin is connected to the INB pin of the DAC 403, and is configured to transmit the green PWM signal G_PWM after voltage conversion to the DAC 403, so that the DAC 403 converts the digital signal G_PWM into the analog signal G1_PWM. The Y3 pin is connected to the INC pin of the DAC 403, and is configured to transmit the blue PWM signal B_PWM after voltage conversion to the DAC 403, so that the DAC 403 converts the digital signal B_PWM into the analog signal B1_PWM.

The Y5 pin is connected to the first input of the operational amplifier A1 in the first selection circuit 404A, and is configured to transmit the enable signal R_EN to the first selection circuit 404A. The Y6 pin is connected to the first input of the operational amplifier A1 in the second selection circuit 404B, and is configured to transmit the enable signal G_EN to the second selection circuit 404B. The Y7 pin is connected to the first input of the operational amplifier A1 in the third selection circuit 404C, and is configured to transmit the enable signal B_EN to the third selection circuit 404C.

The A10 pin is connected to a master control port LMPCTRL and an external master control port EN. The master control port LMPCTRL may be connected to the display control circuit 401 (not shown in the figure), and the external master control port EN may be connected to an external microcontroller (e.g., an MCU, which is not shown in the figure). Both the master control port LMPCTRL and the external master control port EN are configured to control a potential of an LED_EN signal output by the Y10 pin of the Buffer chip U1. The Y10 pin is connected to an external power supply circuit (not shown in the figure) connected to the power supply pin VCC of the driving chip U2 in the laser chip driving circuits 402A, 402B and 402C, and is configured to output the potential of the LED_EN signal. In a case where the LED_EN signal is at the effective potential, the external power supply circuit may supply power to the driving chip U2. In a case where the LED_EN signal is at the ineffective potential, the external power supply circuit stops supplying power to the driving chip U2.

It should be understood that, in order to ensure the stability of the signal, the A1 pin, the A2 pin, the A3 pin, the A5 pin, the A6 pin and the A7 pin are respectively connected with pull-down resistors R4, R5, R6, R7, R8 and R9. Resistance values of the resistor R4 to the resistor R9 may all be 10 kΩ.

The Buffer chip U1 further includes a $\overline{OE1}$ pin, a GND pin, a VCC pin and a $\overline{OE2}$ pin. The $\overline{OE1}$ pin, the GND pin, and the $\overline{OE2}$ pin are all grounded. The VCC pin is connected to a power supply terminal VCC6 through a filter circuit formed by an inductor L1 and a capacitor C8, and is configured to filter and shape the voltage signal provided by the power supply terminal VCC6. A voltage provided by the power supply terminal VCC6 may be 3V. A parameter of the capacitor C8 can be 100n/16V. A model of the inductor L1 may be BLM15AG121SN1D.

In this way, the PWM signals and the enable signals transmitted by the display control circuit 401 are transmitted to the buffer circuit 405. The buffer circuit 405 adjusts the voltage of the PWM signals and the voltage of the enable signals, and transmits the adjusted PWM signals and the adjusted enable signals to the subsequent circuit, which can adapt to different situations that different circuits adopt different PWM signal voltages and different enable signal voltages. As a result, the driving ability of the PWM signals and the enable signals transmitted to the subsequent circuit is improved, and the stable and efficient operation of the subsequent circuit is guaranteed.

It should be understood that in the circuit system architecture 400 shown in FIG. 24A, there may be no selection circuits 404A, 404B, and 404C, or there may be no DAC 403. That is, the buffer circuit 405 may be added on the basis of FIG. 11A or FIG. 18A.

A person skilled in the art will easily think of other embodiments of the present disclosure after considering the specification and practicing the application disclosed herein. The application is intended to cover any variations, uses, or adaptive changes of the present disclosure. These variations, uses, or adaptive changes follow general principles of the application and include common knowledge or conventional technical means in the technical field that are not disclosed in the present disclosure. The description and the embodiments are only regarded as exemplary. The true scope and spirit of the application are pointed out by the claims.

It can be understood that the application is not limited to the structure that has been described above and shown in the drawings, and various modifications and changes may be made without departing from its scope. The scope of the application is limited by the following claims.

What is claimed is:

1. A laser projection apparatus, comprising:
   a laser source configured to provide illumination beams, wherein the laser source includes a laser assembly encapsulated with laser chips of three primary colors;
   an optical engine configured to modulate the illumination beams based on an image signal to obtain projection beams;
   a projection lens configured to project the projection beams for imaging; and
   a circuit system architecture configured to control the laser source to emit laser beams of the three primary colors; wherein
   the circuit system architecture includes:
      a display control circuit configured to generate three pulse width modulation (PWM) signals corresponding to the laser chips of the three primary colors based on three primary color components of an image to be displayed, and generate three enable signals corresponding to the laser chips of the three primary colors based on a preset ratio of a lighted period of the laser chips of the three primary colors in one drive period; each PWM signal being configured to control a brightness of laser beams emitted from a laser chip of a corresponding color; each enable signal being configured to control a lighted period of a laser chip of a corresponding color in the one drive period; and
      a laser chip driving circuit electrically connected to pins corresponding to the laser chips of the three primary colors, the laser chip driving circuit being electrically connected to the display control circuit, and being configured to receive a PWM signal of a corresponding color and an enable signal of a corresponding color, so as to drive a laser chip of the corresponding color to emit laser beams of the corresponding color according to the PWM signal of the corresponding color when the enable signal of the corresponding color is at an effective potential, wherein
   in the one drive period of the laser source, a ratio among durations during which the three enable signals are at the effective potential meets a preset ratio;
   the one drive period of the laser source includes a timing output phase; and
   in the timing output phase, the three enable signals are sequentially generated at the effective potential under control of the display control circuit, and periods during which the three enable signals are at the effective potential do not overlap with each other.

2. The laser projection apparatus according to claim 1, wherein the one drive period of the laser source is a reciprocal of a refresh rate per second of the laser projection apparatus.

3. The laser projection apparatus according to claim 1, wherein the one drive period of the laser source further includes a superimposed output phase; and
   in the superimposed output phase, at least two of the three enable signals are simultaneously at the effective potential under control of the display control circuit.

4. The laser projection apparatus according to claim 1, wherein the display control circuit includes:
   three PWM outputs electrically connected to the laser chip driving circuit and configured to transmit the three PWM signals to the laser chip driving circuit; and
   three enable outputs electrically connected to the laser chip driving circuit and configured to transmit the three enable signals to the laser chip driving circuit.

5. The laser projection apparatus according to claim 4, wherein the laser chip driving circuit includes:
   a driving chip configured to receive the PWM signal of the corresponding color and the enable signal of the corresponding color and output a driving signal to an external sub-circuit according to the PWM signal of the corresponding color when the enable signal of the corresponding color is at the effective potential; and
   the external sub-circuit being configured to receive the driving signal and adjust a driving voltage output by the external sub-circuit according to the driving signal, so that the driving voltage drives the laser chip of the corresponding color to emit laser beams of the corresponding color.

6. The laser projection apparatus according to claim 5, wherein the driving chip includes:
   a first input configured to receive the PWM signal of the corresponding color;
   a second input configured to receive the enable signal of the corresponding color;
   an output connected to the external sub-circuit and configured to output the driving signal to the external sub-circuit according to the PWM signal of the corresponding color when the enable signal of the corresponding color is at the effective potential; and
   a third input connected to the external sub-circuit and configured to receive a feedback voltage of the external sub-circuit, so that the driving chip adjusts a duty cycle of the driving signal according to the PWM signal of the corresponding color and the feedback voltage.

7. The laser projection apparatus according to claim 6, wherein the external sub-circuit includes:
   a switching field effect transistor, a gate of the switching field effect transistor being connected to the output of the driving chip, a source of the switching field effect transistor being connected to the third input of the driving chip, and a drain of the switching field effect transistor being connected to a power supply;
a transformer, one end of the transformer being connected to the source of the switching field effect transistor, and another end of the transformer being connected to a driving output of the external sub-circuit;
a sampling resistor, one end of the sampling resistor being connected to the source of the switching field effect transistor, and another end of the sampling resistor being grounded;
a power supply configured to provide a power supply voltage to the laser chip driving circuit; and
the driving output being configured to output a driving voltage to the laser chip of the corresponding color, so as to drive the laser chip of the corresponding color to emit laser beams of the corresponding color.

8. The laser projection apparatus according to claim 7, wherein the external sub-circuit further includes:
a diode combination connected between the power supply and the transformer, and between the power supply and the drain of the switching field effect transistor.

9. The laser projection apparatus according to claim 8, wherein the diode combination includes two diodes connected in parallel; an anode of each diode is connected to the drain of the switching field effect transistor, and a cathode of each diode is connected to the power supply.

10. The laser projection apparatus according to claim 4, wherein the circuit system architecture further includes:
a digital-to-analog converter configured to receive the three PWM signals output by the display control circuit, and convert the three PWM signals into three corresponding analog PWM signals;
the digital-to-analog converter includes:
three inputs connected to the three PWM outputs of the display control circuit; and
three outputs connected to three inputs of a laser chip driving circuit of a corresponding color.

11. The laser projection apparatus according to claim 10, wherein the circuit system architecture further includes:
a selection circuit electrically connected to the laser chip driving circuit and configured to receive the analog PWM signal of the corresponding color and the enable signal of the corresponding color, so as to output the analog PWM signal of the corresponding color to the laser chip driving circuit when the received enable signal of the corresponding color is at the effective potential.

12. The laser projection apparatus according to claim 11, wherein the selection circuit includes:
a first input connected to an output of a corresponding color in the digital-to-analog converter to receive the analog PWM signal of the corresponding color;
a second input connected to an enable output of the corresponding color in the display control circuit to receive the enable signal of the corresponding color; and
an output connected to an input of a laser chip driving circuit of the corresponding color, and configured to output the received analog PWM signal of the corresponding color to the laser chip driving circuit of the corresponding color when the received enable signal of the corresponding color is at the effective potential.

13. The laser projection apparatus according to claim 11, wherein the selection circuit includes a selection sub-circuit, and the selection sub-circuit includes a switching converter; the switching converter includes:
an input connected to an output of a corresponding color of the digital-to-analog converter, so as to receive an analog PWM signal of the corresponding color;
an enable terminal connected to an enable output of the corresponding color in the display control circuit, so as to receive an enable signal of the corresponding color; and
a first output connected to a laser chip driving circuit of the corresponding color and configured to output the analog PWM signal of the corresponding color to the laser chip driving circuit of the corresponding color when the received enable signal of the corresponding color is at the effective potential.

14. The laser projection apparatus according to claim 13, wherein the selection circuit further includes:
an adaptation sub-circuit, an input of the adaptation sub-circuit being connected to the enable output of the corresponding color in the display control circuit, and an output of the adaptation sub-circuit being connected to the enable terminal of the selection sub-circuit, wherein,
the adaptation sub-circuit is configured to adjust a voltage of the received enable signal of the corresponding color, so as to output the enable signal of the corresponding color that matches a power supply voltage of the selection sub-circuit.

15. The laser projection apparatus according to claim 10, wherein the circuit system architecture further includes:
a buffer circuit connected to the three PWM outputs of the display control circuit and the three enable outputs of the display control circuit, and configured to receive the three PWM signals and the three enable signals to adjust a voltage of each PWM signal and a voltage of each enable signal;
the buffer circuit includes:
three PWM inputs connected to the three PWM outputs of the display control circuit;
three enable inputs connected to the three enable outputs of the display control circuit;
three PWM outputs connected to the three inputs of the digital-to-analog converter; and
three enable outputs connected to three inputs of the laser chip driving circuit.

16. The laser projection apparatus according to claim 12, wherein the circuit system architecture further includes:
a buffer circuit connected to the three PWM outputs of the display control circuit and the three enable outputs of the display control circuit, and configured to receive the three PWM signals and the three enable signals to adjust a voltage of each PWM signal and a voltage of each enable signal;
the buffer circuit includes:
three PWM inputs connected to the three PWM outputs of the display control circuit;
three enable inputs connected to the three enable outputs of the display control circuit;
three PWM outputs connected to the three inputs of the digital-to-analog converter; and
three enable outputs connected to three second inputs of the selection circuit.

17. A laser projection apparatus, comprising:
a laser source configured to provide illumination beams, wherein the laser source includes a laser assembly encapsulated with laser chips of three primary colors;
an optical engine configured to modulate the illumination beams based on an image signal to obtain projection beams;

a projection lens configured to project the projection beams for imaging; and a circuit system architecture configured to control the laser source to emit laser beams of the three primary colors; wherein the circuit system architecture includes:

a display control circuit configured to generate three pulse width modulation (PWM) signals corresponding to the laser chips of the three primary colors based on three primary color components in a preset color scheme of the laser projection apparatus, and generate three enable signals corresponding to the laser chips of the three primary colors based on a preset ratio of a lighted period of the laser chips of the three primary colors in one drive period; each PWM signal being configured to control a brightness of laser beams emitted from a laser chip of a corresponding color; each enable signal being configured to control a lighted period of a laser chip of a corresponding color in the one drive period; and a laser chip driving circuit electrically connected to pins corresponding to the laser chips of the three primary colors, the laser chip driving circuit being electrically connected to the display control circuit, and being configured to receive a PWM signal of a corresponding color and an enable signal of the corresponding color, so as to drive a laser chip of the corresponding color to emit laser beams of the corresponding color according to the PWM signal of the corresponding color when the enable signal of the corresponding color is at an effective potential, wherein in the one drive period of the laser source, a ratio among durations during which the three enable signals are at the effective potential meets a preset ratio;

the one drive period of the laser source includes a timing output phase; and in the timing output phase, the three enable signals are sequentially generated at the effective potential under control of the display control circuit, and periods during which the three enable signals are at the effective potential do not overlap with each other.

18. A laser projection apparatus, comprising:

a laser source configured to provide illumination beams, wherein the laser source includes a laser assembly encapsulated with laser chips of two colors;

an optical engine configured to modulate the illumination beams based on an image signal to obtain projection beams;

a projection lens configured to project the projection beams for imaging; and a circuit system architecture configured to control the laser source to emit laser beams of three primary colors; wherein the circuit system architecture includes:

a display control circuit being configured to generate three pulse width modulation (PWM) signals corresponding to the three primary colors based on three primary color components of an image to be displayed, and generate three enable signals corresponding to the three primary colors based on a preset ratio of duration of the laser beams of the three primary colors in one drive period; each PWM signal being configured to control a brightness of laser beams of a corresponding color emitted by the laser source; each enable signal being configured to control duration of laser beams of the corresponding color in one drive period;

a laser chip driving circuit electrically connected to pins corresponding to the laser chips of two colors;

the laser chip driving circuit being electrically connected to the display control circuit and configured to receive PWM signals and enable signals corresponding to the laser chips of the two colors, so as to drive the laser chips of the two colors to emit laser beams of a first color and laser beams of a third color according to the PWM signals when the enable signals are at an effective potential;

the laser chip driving circuit being also configured to receive a PWM signal and an enable signal corresponding to a second color to drive the laser chip of the third color to generate the laser beams of the third color according to the PWM signal corresponding to the second color when the enable signal corresponding the second color is at an effective potential, so that the laser beams of the third color irradiate a phosphor wheel to generate fluorescence beams of a second color; and the laser beams of the first color, the fluorescence beams of the second color, and the laser beams of the third color are capable of being mixed to form white beams, and the first color, the second color, and the third color are different from each other, wherein in the one drive period of the laser source, a ratio among durations during which the three enable signals are at the effective potential meets a preset ratio;

the one drive period of the laser source includes a timing output phase; and in the timing output phase, the three enable signals are sequentially generated at the effective potential under control of the display control circuit, and periods during which the three enable signals are at the effective potential do not overlap with each other.

\* \* \* \* \*